United States Patent
Maeda et al.

(10) Patent No.: US 8,018,702 B2
(45) Date of Patent: Sep. 13, 2011

(54) POWER SUPPLY ABNORMALITY DETECTION CIRCUIT FOR ON-VEHICLE ELECTRONIC CONTROL DEVICE

(75) Inventors: Tetsuo Maeda, Kobe (JP); Masaharu Yuhara, Chiyoda-ku (JP); Masahide Fujita, Chiyoda-ku (JP); Michihiro Takata, Chiyoda-ku (JP); Takayuki Yano, Kobe (JP); Daisuke Yase, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 519 days.

(21) Appl. No.: 12/267,225

(22) Filed: Nov. 7, 2008

(65) Prior Publication Data

US 2009/0316320 A1 Dec. 24, 2009

(30) Foreign Application Priority Data

Jun. 18, 2008 (JP) ................................. 2008-159522

(51) Int. Cl.
*H02H 3/00* (2006.01)
(52) U.S. Cl. ........................................................ 361/92
(58) Field of Classification Search .................... 361/92, 361/90
See application file for complete search history.

(56) References Cited

U.S. PATENT DOCUMENTS

| 6,535,116 B1 * | 3/2003 | Zhou ............................. 340/447 |
| 7,187,225 B2 * | 3/2007 | Yuhara et al. ................. 327/309 |
| 7,504,743 B2 * | 3/2009 | Matsumoto et al. ......... 307/10.1 |

FOREIGN PATENT DOCUMENTS

| JP | 03262757 A | 11/1991 |
| JP | 8-114530 A | 5/1996 |
| JP | 8-198038 A | 8/1996 |
| JP | 9-119889 A | 5/1997 |
| JP | 2003-191804 A | 7/2003 |

OTHER PUBLICATIONS

Japanese Office Action corresponding to Japanese Patent Application No. 2008-159522, dated Apr. 30, 2010. Full translation.

* cited by examiner

*Primary Examiner* — Stephen W Jackson
(74) *Attorney, Agent, or Firm* — Sughrue Mion, PLLC

(57) ABSTRACT

The on-vehicle electronic control device includes a main power supply circuit fed with power from an on-vehicle battery through an output contact of a power supply relay and a main power supply terminal of a connector to supply a stabilized control voltage to a microprocessor. When contact failure occurs in the main power supply terminal, the main power supply circuit is fed with bypass power from the output contact through a first electrical load and a commutation diode to perform the one of the report of the abnormality and the storage of the abnormality occurrence history information. A bypass power fed state is detected when an input voltage to the main power supply circuit is lower than a power supply voltage of the on-vehicle battery.

15 Claims, 5 Drawing Sheets

POWER SUPPLY ABNORMALITY DETECTION CIRCUIT FOR ON-VEHICLE ELECTRONIC CONTROL DEVICE

BACKGROUND OF THE INVENTION

1. Field of the Invention

The present invention relates to a power supply abnormality detection circuit for an on-vehicle electronic control device, for reducing an abnormality of a feed circuit, and particularly, a trouble caused due to contact failure of a power supply terminal of a connector for connection in, for example, an engine control device fed with power from an on-vehicle battery through an output contact of a power supply relay.

2. Description of the Related Art

In an on-vehicle electronic control device fed with power from an on-vehicle battery through an output contact of a power supply relay, when an operation of the on-vehicle electronic control device is abnormal, it is important to determine whether or not a normal power supply voltage is applied in order to facilitate a maintenance check.

However, for example, while the on-vehicle electronic control device is not fed with power because of the abnormality of the power supply relay, it is difficult to determine and store an abnormal state in the on-vehicle electronic control device with no power being fed.

Therefore, there are conventional technologies with the following structures (see, for example, JP 2003-191804 A, JP 08-114530 A, JP 09-119889 A, and JP 08-198038 A). In a vehicle communication system described in JP 2003-191804 A, communication means for communicating data through communication lines wired in a vehicle are provided in a plurality of electrical devices mounted on the vehicle, whereby data can be transmitted and received among the respective electrical devices. A plurality of communication means for communicating the same data using different communication lines and selection means for selecting normal reception data from a plurality of items of reception data obtained by communication using the plurality of communication means are provided in each of the electrical devices. Provided as the electrical device is a power supply monitor device for monitoring a power supply state from an on-vehicle power source to an on-vehicle device including the respective electrical devices and transmitting a result obtained by monitoring to other electrical devices through the plurality of communication means including low-speed communication means, which is a feature of the vehicle communication system.

A power supply failure detection device described in JP 08-114530 A includes: a first power supply circuit for supplying power from an on-vehicle power supply to an on-vehicle electrical load including an on-vehicle electronic control unit through a key switch; voltage drop detecting means for detecting a voltage drop of the first power supply circuit and outputting a result obtained by detection to the on-vehicle electronic control unit; abnormality determining means which is provided in the on-vehicle electronic control unit, for determining an abnormality of the first power supply circuit based on an output of the voltage drop detecting means; abnormality handling means which is provided in the on-vehicle electronic control unit, for storing abnormality information based on a determination result obtained by the abnormality determining means or operating an abnormality display device; and a second power supply circuit for supplying operating power to the on-vehicle electronic control unit at the time of the voltage drop of the first power supply circuit.

An abnormality warning device for a vehicle which is described in JP 09-119889 A includes abnormality diagnosing means for diagnosing the presence or absence of an abnormality of a specific region of a vehicle. In the abnormality warning device for a vehicle, when the abnormality is detected by the abnormality diagnosing means, warning display means is driven by a driving circuit to display a warning. A feature of the abnormality warning device is to have wiring which is formed such that driving power to be supplied to the driver circuit of the warning display means is supplied through the warning display means. With this feature, for example, even when an abnormality of a power supply system for an engine control device occurs, a warning can be displayed.

A back-up power supply device for a vehicular electronic control unit which is described in JP 08-198038 A includes: a first power supply line connected between a battery and a microprocessor of the vehicular electronic control unit through a key switch; a second power supply line connected directly between the battery and the control unit without through the key switch; a load connected with the battery through the key switch; comparator means for comparing a voltage of the first power supply line with a voltage supplied to the load and generating a trigger output when the former is lower than the latter; and switch means operated to be closed in response to the trigger output to make electrical connection between the first power supply line and the second power supply line.

However, the conventional technologies have the following problems.

According to the vehicle communication system described in JP 2003-191804 A, when a power supply is not supplied to any of the large number of electrical devices which are illustrated, an abnormal state can be reported to other electrical devices or an abnormality can be indicated by a display device.

However, when contact failure of a connector to be connected with an electrical device causes the abnormality regardless of the normal operation of a power supply relay (not shown), there is a problem in that the cause of the abnormality cannot be identified. In addition, there is a problem in that the electrical device itself cannot determine the abnormality, report the abnormality, or store abnormality occurrence information.

In the power supply failure detection device described in JP 08-114530 A, two power supply relays are used to selectively switch between power feed circuits, and one of the power supply relays which causes an abnormality due to instantaneous power interruption is replaced by the other power supply relay, whereby the electronic control unit is fed with power through the other power supply relay. An anti-instantaneous power interruption circuit including the pair of power supply relays is provided outside the electronic control unit.

The electronic control unit is generally housed in a sealed case including high-density contactless electronic parts, and thus electromagnetic relays which are consumable parts causing contact arc cannot be incorporated. Therefore, when the contact failure of the connector to be connected with the electronic control unit causes the abnormality, there is a problem in that the cause of the abnormality cannot be identified. In addition, there is a problem in that the electronic control unit itself cannot determine the abnormality, report the abnormality, or store the abnormality occurrence information.

According to the abnormality warning device for a vehicle which is described in JP 09-119889 A, when an output contact of a power supply relay causes contact failure, the abnormality can be indicated by the warning lamp. However, the abnormality occurrence information cannot be stored. In addition, there is a problem in that whether the output contact causes the contact failure or a power supply terminal of the connector causes the contact failure cannot be determined.

The back-up power supply device for a vehicular electronic control unit which is described in JP 08-198038 A requires power transistors serving as a back-up power supply, which may cause increases in size and cost.

SUMMARY OF THE INVENTION

The present invention has been made to solve the problems as described above. An object of the present invention is to obtain a power supply abnormality detection circuit for an on-vehicle electronic control device in which, when contact failure occurs in a power supply connector of the on-vehicle electronic control device, one of a report of an abnormality and a storage of abnormality occurrence information is performed by the on-vehicle electronic control device to alarm drivers, thereby facilitating a maintenance check and disabling or enabling a part of a control output in order to prevent the on-vehicle electronic control device from performing a dangerous abnormal operation.

According to the present invention, a power supply abnormality detection circuit for an on-vehicle electronic control device includes: a nonvolatile program memory in which a control program is stored; an input interface circuit connected with one of a switching contact and an analog input sensor; a first output interface circuit connected with a first electrical load; a second output interface circuit connected with a second electrical load; a microprocessor that controls the first electrical load and the second electrical load based on a content of the control program stored in the nonvolatile program memory and an operating state of the one of the switching contact and the analog input sensor; and a main power supply circuit fed with power from an on-vehicle battery through an output contact of a power supply relay and a main power supply terminal of a connector to supply a stabilized control power supply voltage to the microprocessor. The first electrical load is connected between the output contact of the power supply relay and a first switching element serving as the first output interface circuit to be subjected to power feed control in response to switching of the first switching element, and the first switching element is connected in parallel with a commutation diode through which a load current of the first electrical load from the main power supply terminal returns when the first switching element is opened. The second electrical load is connected between the output contact of the power supply relay and a second switching element serving as the second output interface circuit to be subjected to power feed control in response to switching of the second switching element, and the second switching element is connected in parallel with a constant-voltage diode for rapidly reducing a load current of the second electrical load when the second switching element is opened. The control program serves as bypass detection means, abnormality processing means, and bypass measure means to operate the microprocessor. The bypass detection means detects that an input voltage to the main power supply circuit is a voltage lower than a power supply voltage of the on-vehicle battery to detect a bypass power fed state in which the main power supply circuit is fed with bypass power from the output contact of the power supply relay through the first electrical load and the commutation diode because of contact failure of the main power supply terminal. The abnormality processing means operates when the bypass detection means detects the bypass power fed state, performs one of a report of an abnormality and a storage of abnormality occurrence history information in a storage section, and stops at least a part of a control output. The bypass measure means operates when the bypass detection means detects the bypass power fed state, and causes one of the first switching element to be closed and the opened state to be held.

Therefore, even when contact failure occurs in the main power supply terminal, the on-vehicle electronic control device is fed with power. Thus, there is an effect that the on-vehicle electronic control device is prevented from generating an abnormal control output to ensure safety, and then one of a report of an abnormality occurrence state and a storage of at least abnormality occurrence history information for facilitating a maintenance check is performed, thereby improving maintainability.

The present invention is particularly effective when the number of main power supply terminals connected in parallel is small in a case where, for example, a plurality of ground terminals are connected in parallel to improve contact reliability because the number of terminals of the connector is tight. Therefore, there is an effect that the on-vehicle electronic control device can be reduced in size at low cost.

DETAILED DESCRIPTION OF THE PREFERRED EMBODIMENTS

Hereinafter, power supply abnormality detection circuits for an on-vehicle electronic control device according to preferred embodiments of the present invention are described with reference to the attached drawings.

Embodiment 1

Figure 1:
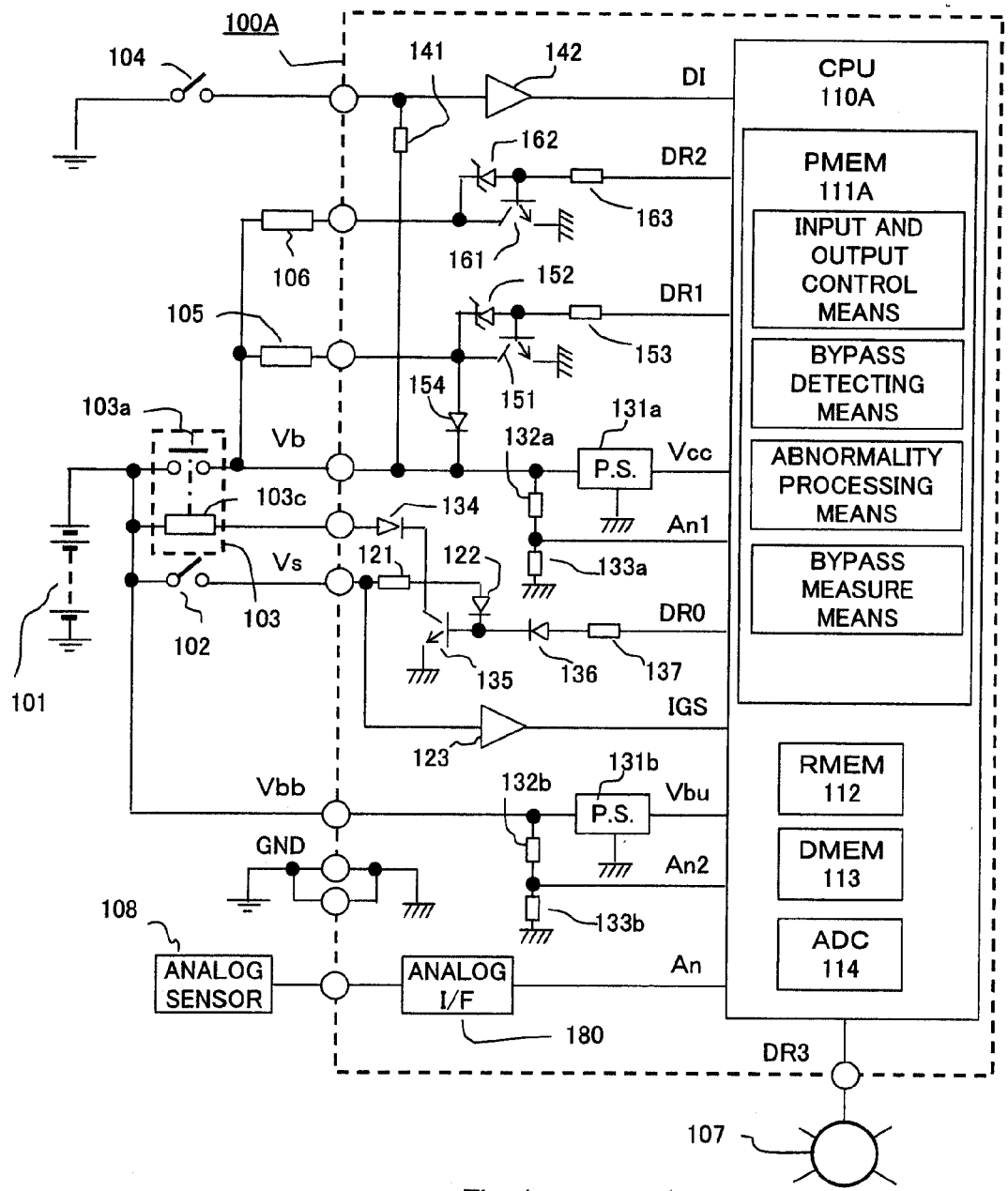
FIG. 1 is an entire structural diagram showing an on-vehicle electronic control device according to Embodiment 1 of the present invention.

FIG. 1 is an entire structural diagram showing an on-vehicle electronic control device according to Embodiment 1 of the present invention. In FIG. 1, an on-vehicle electronic control device 100A includes a microprocessor 110A as a main part and is fed with power from an on-vehicle battery 101 through an output contact 103a of a power supply relay 103 and a main power supply terminal Vb of a connector (not shown).

The power supply relay 103 includes an exciting coil 103c energized in response to actuation of a power supply switch 102. The power supply switch 102 is connected with the on-vehicle electronic control device 100A through an instruction power supply terminal Vs.

An switching sensor 104 which is provided outside the on-vehicle electronic control device 100A and connected therewith represents, for example, a high-speed switching signal ON/OFF-operated in synchronization with rotation of an engine such as an engine rotation sensor or a crank angle sensor, or an operating switch such as a selection switch of a shift lever for transmission, an accelerator pedal switch, or a brake pedal switch.

A first electrical load 105 driven by the on-vehicle electronic control device 100A is, for example, an electromagnetic valve controlling solenoid load which is represented by a variable valve timing controlling solenoid, an intake flow controlling solenoid, or a variable intake pipe length controlling solenoid. One or a plurality of solenoids are used.

A second electrical load group 106 driven by the on-vehicle electronic control device 100A is an electrical load group which represents an electrical load which is operated in conjunction with the rotation of the engine or directly associated with driving of the engine, such as an electromagnetic valve for fuel injection, an ignition coil (in a case of a gasoline engine), or an intake valve opening degree control motor, or an auxiliary electrical load which is not directly associated with driving of the engine, such as a power supply relay for feeding power to the load or an electromagnetic clutch for air conditioner driving.

A warning indicator 107 serves as a display device operated in response to actuation of abnormality warning means 204a described later and is driven through a control output terminal DR3 of the microprocessor 110A.

An analog sensor 108 represents, for example, an analog sensor for drive-controlling the engine, such as an accelerator position sensor for detecting a degree of depression of an accelerator pedal, a throttle position sensor for detecting a degree of valve opening of an intake throttle, an air flow sensor for detecting an amount of intake air into the engine, or an exhaust gas sensor for detecting an oxygen concentration of an exhaust gas, or an analog sensor such as an engine cooling water temperature sensor, a hydraulic sensor, or a barometric pressure sensor.

The on-vehicle battery 101 is directly connected with the on-vehicle electronic control device 100A through an auxiliary power supply terminal Vbb. A negative terminal of the on-vehicle battery 101 is connected with a vehicle body. A plurality of contact terminals each serving as a ground terminal GND of the on-vehicle electronic control device 100A are used in parallel and connected with the vehicle body.

Next, a structure of the microprocessor 110A used in the on-vehicle electronic control device 100A is described. The microprocessor 110A includes, for example, a nonvolatile program memory 111A serving as a flash memory, a RAM memory 112 for arithmetic processing, a nonvolatile data memory 113, and a multi-channel A/D converter 114, which are cooperated with one another.

The multi-channel A/D converter may be separately provided outside the microprocessor 110A. The nonvolatile program memory 111A stores a control program serving as bypass detection means, abnormality processing means, and bypass measure means, which are described later with reference to FIG. 2, in addition to input and output control programs and various control constants. That is, the control program causes the microprocessor 110A to function as the bypass detection means, the abnormality processing means, and the bypass measure means.

The data memory 113 is an EEPROM serial connected with the microprocessor 110A. Alternatively, a part of a memory region of the nonvolatile program memory 111A serving as the flash memory is used as the data memory 113 and is separated, as a memory block which can be collectively erased, from a main memory region.

A main power supply circuit 131a is fed with a voltage from the main power supply terminal Vb and generates a stabilized control power supply voltage Vcc to be fed to the microprocessor 110A. Main voltage dividing circuits 132a and 133a are connected in series and include voltage dividing resistors fed with the voltage from the main power supply terminal Vb. A voltage across the voltage dividing resistor 133a is supplied as a first dividing voltage An1 to an analog input port of the microprocessor 110A.

An auxiliary power supply circuit 131b is fed with a voltage from the auxiliary power supply terminal Vbb and generates a backup power supply voltage Vbu to be fed to the RAM memory 112. Comparison voltage dividing circuits 132b and 133b are connected in series and include voltage dividing resistors for the voltage fed from the auxiliary power supply terminal Vbb. A voltage across the voltage dividing resistor 133b is supplied as a second dividing voltage An2 to an analog input port of the microprocessor 110A.

A diode 134 and a driving transistor 135 are connected in series and serve as a negative-terminal side circuit for the exciting coil 103c of the power supply relay 103. A driving resistor 121 and a diode 122 are connected in series between the instruction power supply terminal Vs and a base terminal of the driving transistor 135.

An interface circuit 123 is connected between the instruction power supply terminal Vs and a power supply turn-on instruction signal terminal IGS of the microprocessor 110A and serves as an input signal circuit for determining whether or not the power supply switch 102 is closed.

A diode 136 and a driving resistor 137 are connected in series between a self-hold instruction signal terminal DR0 of the microprocessor 110A and the base terminal of the driving transistor 135.

An input interface circuit 142 is connected between the switching sensor 104 and an input port DI of the microprocessor 110A and includes a low-pass filter for performing conversion of a signal voltage level and suppression of a signal noise. Further, a bleeder resistor 141 serving as a pull-up resistor is connected between the main power supply terminal Vb and an input terminal of the input interface circuit 142.

A first switching element 151 serving as a first output interface circuit includes a power transistor connected with the first electrical load 105 at a downstream position. In order to suppress the generation of an open-circuit surge voltage, a constant-voltage diode 152 whose operating voltage is larger than a maximum power supply voltage of the on-vehicle battery 101 is connected between a collector terminal and a base terminal of the power transistor. The base terminal of the power transistor is connected with a first control output terminal DR1 of the microprocessor 110A through a driving resistor 153.

A commutation diode 154 is connected between a collector terminal of a power transistor 151 and the main power supply terminal Vb and connected in reverse parallel to the first electrical load 105.

A second switching element 161 serving as a second output interface circuit includes a power transistor connected with the second electrical load 106 at a downstream position. In order to suppress the generation of an open-circuit surge voltage, a constant-voltage diode 162 whose operating voltage is larger than the maximum power supply voltage of the on-vehicle battery 101 is connected between a collector terminal and a base terminal of the power transistor. The base terminal of the power transistor is connected with a second control output terminal DR2 of the microprocessor 110A through a driving resistor 163.

An input interface circuit 180 is a filter circuit connected between an analog sensor 108 and an analog input port An of the microprocessor 110A.

Next, the action and operation of the on-vehicle electronic control device having the structure shown in FIG. 1 according to Embodiment 1 of the present invention will be described in detail.

In FIG. 1, when the power supply switch 102 is closed, a base current flows into the driving transistor 135 through the driving resistor 121 and the diode 122, and hence the driving transistor 135 is turned on to energize the exciting coil 103c. As a result, the output contact 103a is closed to feed the voltage to the main power supply circuit 131a.

When the main power supply circuit 131a generates the control power supply voltage Vcc, the microprocessor 110A activates. Then, when the microprocessor 110A generates a self-hold instruction signal DR0, the base current is supplied to the driving transistor 135 through the driving resistor 137 and the diode 136. As a result, even when the power supply switch 102 is opened, the exciting coil 103c continues to be energized until the self-hold instruction signal DR0 is stopped.

The activated microprocessor 110A drive-controls the first electrical load 105 and the second electrical load 106 based on an operating state of the switching sensor 104, a level of an output voltage of the analog sensor 108, and contents of the input and output control programs stored in the nonvolatile program memory 111A.

The first electrical load 105 is supplied with an average current corresponding to a switching duty of the first switching element 151. When the first switching element 151 is changed from a closed state to an opened state, a current flowing through the first electrical load 105 returns through a commutation diode 154 to reduce.

In contrast to this, the second electrical load 106 is not connected with a commutation diode. Therefore, when the second switching element 161 is changed from a closed state to an opened state, a current flowing through the second electrical load 106 is rapidly reduced by the constant-voltage diode 162. In this case, the second switching element 161 is turned on such that a voltage thereacross is substantially equal to the operating voltage of the constant-voltage diode 162.

After the main power supply terminal Vb causes contact failure to become a disconnected state, when the first switching element 151 is in the opened state, a bypass power feed circuit is formed so that the main power supply circuit 131a is fed with power from the on-vehicle battery 101 through the output contact 103a of the power supply relay 103, the first electrical load 105, and the commutation diode 154.

In this case, assume that a consumption current I of the on-vehicle electronic control device 100A is 0.22 A (representative value), a resistance value R of the first electrical load 105 is 6.9 Ω to 8.4 Ω, a forward voltage drop Vd of the commutation diode 154 is 0.6 V to 0.8 V. Then, when an applied voltage Vq to the main power supply circuit 131a in a bypass power fed state is expressed by the following expression (1).

$$Vq=Vb-I\times R-Vd=Vb-(2.12\sim2.65) \quad (1)$$

Note that Vb indicates the power supply voltage of the on-vehicle battery 101 which is applied to the main power supply terminal Vb. Therefore, when the on-vehicle battery 101 is not in an over-discharge state, the applied voltage Vq is a voltage sufficient to maintain the operation of the on-vehicle electronic control device 100A.

Figure 2:
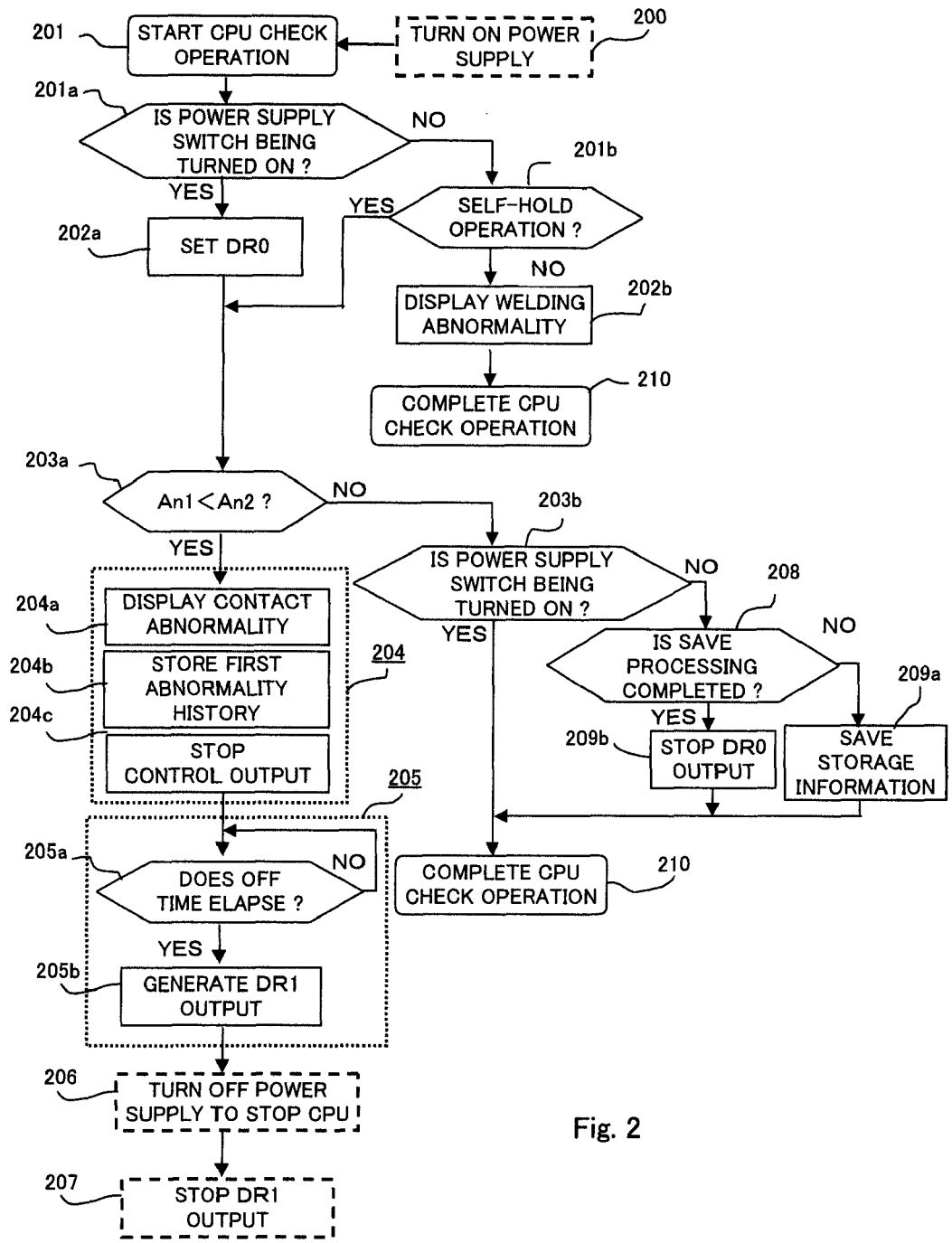
FIG. 2 is a flowchart showing a check operation of the on-vehicle electronic control device according to Embodiment 1 of the present invention.

Next, a check operation of the on-vehicle electronic control device shown in FIG. 1 will be described with reference to a flowchart. FIG. 2 is a flowchart showing the check operation of the on-vehicle electronic control device according to Embodiment 1 of the present invention.

In Step 200 shown in FIG. 2, the power supply switch 102 is closed to feed the on-vehicle electronic control device 100A with power from the on-vehicle battery 101. In subsequent Step 201, the main power supply circuit 131a generates the stabilized control power supply voltage Vcc to activate the microprocessor 110A. The microprocessor 110A starts a power supply voltage check operation.

In subsequent Step 201a, the microprocessor 110A monitors a power supply turn-on instruction signal IGS to determine whether or not the power supply switch 102 is closed. When the power supply switch 102 is closed and thus the determination is YES, processing goes to Step 202a. On the other hand, when the power supply switch 102 is opened and thus the determination is NO, processing goes to Step 201b.

In Step 201b, the microprocessor 110A determines whether or not a self-hold operation is being performed, in which the self-hold instruction signal DR0 is set in Step 202a described later. When the self-hold operation is being performed and thus the determination is YES, processing goes to Step 203a. On the other hand, when the self-hold instruction signal DR0 is reset in Step 209b described later and thus the determination is NO, processing goes to Step 202b.

In Step 202a, the microprocessor 110A sets the self-hold instruction signal DR0. Therefore, even when the power supply switch 102 is opened, the driving transistor 135 is turned on through the driving resistor 137 and the diode 136 until the self-hold instruction signal DR0 is reset in Step 209b described later, thereby maintaining the operation of the power supply relay 103 (see FIG. 1).

Although it is determined in Step 201 a that the power supply switch 102 is in the opened state and it is determined in Step 201b that the self-hold instruction signal DR0 is in a stop state, when the power feed state still continues, Step 202b is executed. In Step 202b, the microprocessor 110A determines a welding abnormality of the output contact 103a of the power supply relay 103 or a power supply short-circuit abnormality in which the main power supply terminal Vb makes contact with a power supply line of the on-vehicle battery 101. The microprocessor 110A causes the warning indicator 107 to report the abnormality or causes the data memory 113 to store the abnormality occurrence information. After that, processing goes to Operation Completion Step 210.

In Step 203a, the microprocessor 110A compares a voltage level of the main power supply terminal Vb which is estimated based on the first dividing voltage An1 and the second dividing voltage An2 with a voltage level of the auxiliary power supply terminal Vbb. For example, the microprocessor 110A determines whether or not the bypass power fed state is resulted from the contact failure of the main power supply terminal Vb, based on whether or not Vbb−Vb≧2.12 (V) is satisfied.

Step 203a corresponds to processing performed by the bypass detection means. In Step 203a, when the bypass power fed state occurs and thus the determination is YES, processing goes to Step 204a. When the bypass power fed state does not occur and thus the determination is NO, processing goes to Step 203b.

In Step 203b, the microprocessor 110A determines again whether or not the power supply switch 102 is closed. When the power supply switch 102 is closed and thus the determination is YES, processing goes to Operation Completion Step 210. When the power supply switch 102 is opened and thus the determination is NO, processing goes to Step 208.

Next, Step Block 204 corresponding to the abnormality processing means will be described. This Step Block 204 includes Step 204a corresponding to the abnormality warning means, Step 204b corresponding to abnormality history storing means, and Step 204c corresponding to control output stopping means.

In Step 204a, the microprocessor 110A causes the warning indicator 107 to report a contact abnormality of the main power supply terminal Vb. In subsequent Step 204b, the microprocessor 110A transfers the abnormality occurrence information to the data memory 113 to store the abnormality occurrence information therein. In subsequent Step 204c, the microprocessor 110A keeps all control output signals DR0, DR1, and DR2 in the stop state.

Note that, in Step 204b corresponding to the abnormality history storing means, the microprocessor 110A reads out abnormality occurrence count information already stored in the data memory 113 and adds one to the read/write count to overwrite the resultant. Only a first abnormality occurring after the power supply switch 102 is closed is used as effective information for adding processing.

Next, Step Block 205 corresponding to the bypass measure means will be described. This Step Block 205 includes Step 205a corresponding to duty control means and Step 205b.

In Step 205a, the microprocessor 110A determines whether or not a stop instruction time of the first control output signal DR1 in Step 204c exceeds a predetermined non-operating time Toff. When the non-operating time has elapsed, the determination is YES and processing goes to Step 205b. On the other hand, when the non-operating time has not elapsed, the determination is NO and processing returns to Step 205a. In subsequent Step 205b, the microprocessor 110A generates the first control output signal DR1 to set a logical level to "H".

Note that the first switching element 151 is closed in Step 205b, and hence the first electrical load 105 is fed with power and bypass power feeding to the main power supply circuit 131a is stopped.

In Step 206 subsequent to Step 205b, an output voltage of the main power supply circuit 131a reduces and thus the microprocessor 110A is stopped, because the bypass power feeding is stopped in Step 205b. In subsequent Step 207, the first control output signal DR1 is also stopped, and hence the first switching element 151 is opened.

As a result, the bypass power feeding using the first electrical load 105 and the commutation diode 154 is started and processing goes to Operation Start Step 201 again. After that, the microprocessor 110A repeats a series of control operations including Step 201a to Step 207.

A power feed time Ton for which the first electrical load 105 is fed with power after the first switching element 151 is closed is a short time determined based on a voltage attenuation time of the main power supply circuit 131 a between Step 205b to Step 206. The first electrical load 105 does not effectively operate based on an energization duty Ton/(Toff+Ton) obtained by taking the non-operating time Toff used in Step 205a into account.

When the main power supply terminal Vb has preferable contact and a normal state is determined in Step 203a, processing goes to Step 203b. In Step 203b, the microprocessor 110A determines a state of the power supply switch 102. In Step 203b, when a closed state of the power supply switch 102 is detected and thus the determination is NO, processing goes to Step 208.

In Step 208, the microprocessor 110A determines whether or not learning storage information and other abnormality occurrence information which are written into the RAM memory 112 have been transferred to the data memory 113 and saved therein. When no saving is performed, the determination is NO and processing goes to Step 209a. On the other hand, when the saving is completed, the determination is YES and processing goes to Step 209b.

In Step 209a, the microprocessor 110A executes transfer and save processing. In Step 209b, the microprocessor 110A stops the self-hold instruction signal DR0. After the execution of Step 209a or Step 209b, processing goes to Operation Completion Step 210.

In Operation Completion Step 210, the microprocessor 110A executes another control operation. After a lapse of a predetermined time, processing goes to Operation Start Step 201 again. However, after the power supply switch 102 is opened and the self-hold instruction signal DR0 is stopped in Step 209b, the power supply relay 103 is de-energized to stop the power feeding to the microprocessor 110A.

As is apparent from the above description, the on-vehicle electronic control device (100A) according to Embodiment 1 is the power supply abnormality detection circuit for the on-vehicle electronic control device (100A) which includes the nonvolatile program memory (111A) in which the control program is stored, the input interface circuit (142, 180) connected with the switching contact (104) or the analog input sensor (108), the first output interface circuit (151) connected with the first electrical load (105), the second output interface circuit (161) connected with the second electrical load (106), the microprocessor (110A) which controls the first electrical load (105) and the second electrical load (106) based on the content of the control program stored in the nonvolatile program memory (111A) and the operating state of the switching contact (104) or the input sensor (108), and the main power supply circuit (131a) which is fed with power from the on-vehicle battery (101) through the output contact (103a) of the power supply relay (103) and the main power supply terminal (Vb) of the connector and which supplies the stabilized control power supply voltage (Vcc) to the microprocessor (110A). The control program serves as the bypass detection means (Step 203a), the abnormality processing means (Step 204), and bypass measure means (Step 205) to operate the microprocessor.

The first electrical load (105) is connected between the output contact (103a) of the power supply relay (103) and the first switching element (151) serving as the first output interface circuit, to be subjected to power feed control in response to the switching of the first switching element (151). The first switching element (151) is also connected in parallel with the commutation diode (154) through which a load current of the first electrical load (105) from the main power supply terminal (Vb) returns when the first switching element (151) is opened.

The second electrical load (106) is connected between the output contact (103a) of the power supply relay (103) and the second switching element (161) serving as the second output interface circuit, to be subjected to power feed control in response to the switching of the second switching element (161). The second switching element (161) is also connected in parallel with the constant-voltage diode (162) for rapidly reducing a load current of the second electrical load (106) when the second switching element (161) is opened.

The bypass detection means (Step 203a) detects that an input voltage to the main power supply circuit (131a) is a voltage lower than the power supply voltage of the on-vehicle battery (101), to thereby detect the state in which the main power supply circuit (131a) is fed with bypass power from the output contact (103a) of the power supply relay (103) through the first electrical load (105) and the commutation diode (154) because of the contact failure of the main power supply terminal (Vb).

The abnormality processing means (Step 204) operates when the bypass detection means (Step 203a) detects the bypass power fed state, reports the abnormality or causes a storage portion to store abnormality occurrence history information, and stops at least a part of the control output.

The bypass measure means (Step 205) operates when the bypass detection means (Step 203a) detects the bypass power fed state, and closes the first switching element (151) or holds the opened state.

The on-vehicle electronic control device (100A) according to Embodiment 1 further includes: the auxiliary power supply circuit (131b) constantly fed with power from the on-vehicle battery (101) through the auxiliary power supply terminal (Vbb) of the connector; a bypass detection circuit section having the main voltage dividing circuits (132a and 133a), the comparison voltage dividing circuits (132b and 133b), and the multi-channel A/D converter (114); and the RAM memory (112) for arithmetic processing.

Even in a state in which the output contact (103a) of the power supply relay (103) is being opened, the auxiliary power supply circuit (131b) continues the power feeding to the RAM memory (112) to hold a storage state of at least a part of the address area.

The main voltage dividing circuits (132a and 133a) divide the applied voltage to the main power supply terminal (Vb) to generate the first dividing voltage (An1). The comparison voltage dividing circuits (132b and 133b) divide the applied voltage to the auxiliary power supply terminal (Vbb) to generate the second dividing voltage. The multi-channel A/D converter (114) performs A/D conversion on the first dividing voltage (An1) and the second dividing voltage (An2) and outputs the resultant to the microprocessor (110A).

When the second dividing voltage (An2) exceeds the first dividing voltage (An1), the bypass detection means (Step 203a) detects the bypass power fed state resulting from the contact failure of the main power supply terminal (Vb).

When the structure as described above is provided, the applied voltage to the main power supply terminal and the applied voltage to the auxiliary power supply terminal are inputted to the microprocessor through the multi-channel A/D converter and compared in level with each other to detect the occurrence of the bypass power fed state.

Therefore, the accurate voltage comparison can be performed. In addition, the respective voltage signals are effectively used in the on-vehicle electronic control device for other purposes, and hence redundant hardware is unnecessary. As a result, the on-vehicle electronic control device is reduced in size and cost.

In the on-vehicle electronic control device (100A) according to Embodiment 1, the bypass measure means (Step 205) operates when the bypass detection means (Step 203a) detects the bypass power fed state, generates the first control output signal (DR1) for closing the first switching element (151) to turn on the first switching element (151), thereby feeding power to the first electrical load (105), stops the first control output signal (DR1) when the bypass power feeding to the main power supply circuit (131a) is stopped to reset the microprocessor (110A), restarts the bypass power feeding from the first electrical load (105) to the main power supply circuit (131a) through the commutation diode (154), and then repeats the same operation based on a result obtained by detecting the bypass power fed state.

The abnormality processing means (Step 204) stops the generation of the second control output signal (DR2) for closing at least the second switching element (161) while the bypass measure means (Step 205) is in the repetitive operation.

In the case where the structure as described above is provided, when the bypass power fed state is detected, the first electrical load is driven to stop the bypass power feeding. Therefore, the microprocessor is subjected to reset processing to perform repetitive power feeding for restarting the bypass power feeding.

Thus, in the bypass power fed state, the other control output signals are stopped to prevent the abnormal operation from being performed. In addition to this, even when an abnormal control output occurs, the bypass power feeding is stopped within a short time, and hence the abnormal control output does not continue. As a result, a substantial stop state can be reliably held to improve the safety.

In the on-vehicle electronic control device (100A) according to Embodiment 1, the bypass measure means (Step 205) further includes duty control means. According to the duty control means, the non-operating time (Toff) is set such that a ratio between the non-operating time (Toff) and the power feed time (Ton) during which the microprocessor (110A) generates the first control output signal (DR1) after the lapse of the predetermined non-operating time (Toff) from the start of the operation made by the bypass power feeding, the first electrical load (105) is fed with power by the generation of the first control output signal (DR1), and the first control output signal is stopped by the stop of the bypass power feeding becomes a short-time power feed ratio in which the first electrical load (105) cannot effectively operate.

When the structure as described above is provided, the ratio between the non-operating time and the power feed time for the first electrical load can be controlled in the bypass power fed state. Therefore, even when the first electrical load is an electromagnetic valve controlling solenoid having specifications capable of effectively operating at a relatively low voltage, a non-operating time ratio can be improved in the bypass power fed state to prevent the effective operation from being performed. The voltage drop in the bypass power fed state can be reduced to suppress a reduction in feed voltage to the main power supply circuit.

In the on-vehicle electronic control device (100A) according to Embodiment 1, the abnormality processing means (Step 204) includes the abnormality history storing means (Step 204b) for storing, as the abnormality occurrence history information, the fact that the bypass detection means (Step 203a) has detected the bypass power fed state, in the nonvolatile data memory (113).

The abnormality history storing means (Step 204b) does not operate in response to the repetitive bypass power feed operation, and causes the nonvolatile data memory (113) to store the abnormality occurrence history information and a cumulative addition value of the number of effective occurrence of the bypass power feeding only when first bypass power feeding occurs after the power supply switch (102) is turned on.

When the structure as described above is provided, the number of effective occurrence of the bypass power fed state can be stored in the nonvolatile data memory. Therefore, initial bypass power feeding after the power supply switch is turned on is counted, and hence the number of data rewriting into the nonvolatile data memory can be reduced. The number of repetitive power feeding is not counted, and hence more accurate information is obtained as maintenance check information.

The on-vehicle electronic control device (100A) according to Embodiment 1 further includes: the driving transistor (135)

turned on in response to a control current from the on-vehicle battery (101) through the power supply switch (102) and the instruction power supply terminal (Vs) of the connector to energize the exciting coil (103c) of the power supply relay (103); and the nonvolatile data memory (113) cooperating with the microprocessor (110A). The control program further serves as welding abnormality detection means (Step 202b) to operate the microprocessor.

The driving transistor (135) is turned on when the power supply switch (102) is closed. The turn-on state is held based on the self-hold instruction signal (DR0) outputted when the power supply relay (103) is energized to start the operation of the microprocessor (110A). Therefore, even when the power supply switch (102) is opened, the power supply relay (103) continues to be in the energization state until the self-hold instruction signal (DR0) is stopped.

In a state where the power supply switch (102) is opened applying no power supply voltage to the instruction power supply terminal (Vs) and the self-hold instruction signal (DR0) is stopped, the welding abnormality detection means (Step 202b) detects that the power supply voltage is applied to the main power supply terminal (Vb), to thereby detect the welding abnormality of the output contact of the power supply relay (103) or the power supply short-circuit abnormality in which an output wiring circuit makes contact with the power supply line of the on-vehicle battery (101), and reports the abnormality using the warning indicator based on a result obtained by detecting the abnormality or causes the nonvolatile data memory (113) to store, as the abnormality occurrence information, the result obtained by detecting the abnormality.

According to the structure as described above, when the power supply voltage is being applied to the main power supply terminal while the exciting coil of the power supply relay is de-energized, the welding abnormality of the output contact of the power supply relay or the power supply short-circuit abnormality of the power supply wiring can be determined. Therefore, the report of the abnormality or the storage of the abnormality occurrence information can be easily performed by the microprocessor.

Embodiment 2

Figure 3:
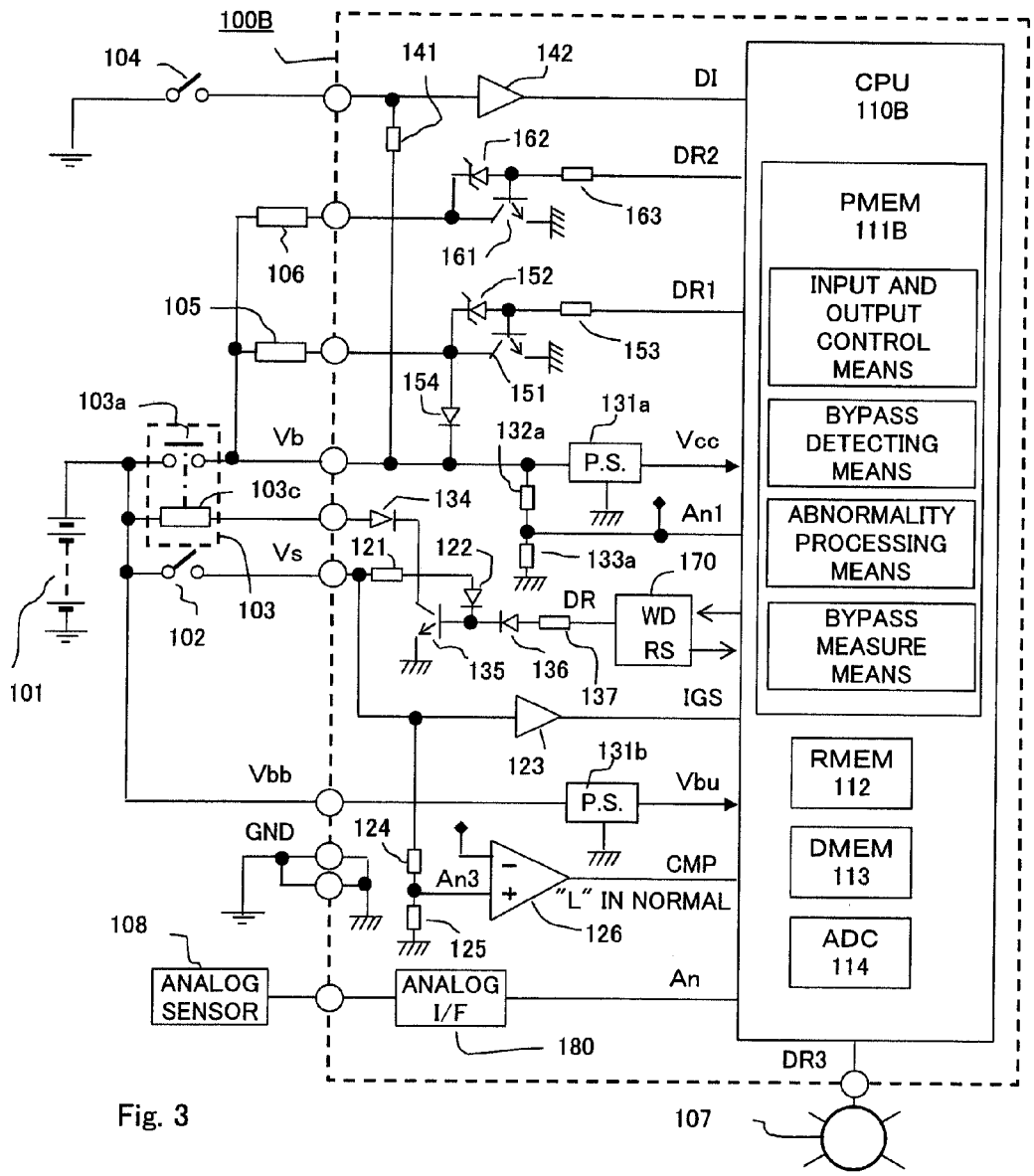
FIG. 3 is an entire structural diagram showing an on-vehicle electronic control device according to Embodiment 2 of the present invention.

FIG. 3 is an entire structural diagram showing an on-vehicle electronic control device according to Embodiment 2 of the present invention. Points different from the structure of FIG. 1 according to Embodiment 1 will be mainly described below. Note that the reference symbols in each drawing indicate the same or corresponding portions.

In FIG. 3, an on-vehicle electronic control device 100B includes a microprocessor 110B as a main part. As in the case of FIG. 1, a power supply switch 102, a power supply relay 103, a switching sensor 104, a first electrical load 105, a second electrical load 106, a warning indicator 107, and an analog sensor 108 are provided outside the on-vehicle electronic control device 100B and connected with one another.

As in the case of FIG. 1, the on-vehicle electronic control device 100B includes a microprocessor 110B, a main power supply circuit 131a, an auxiliary power supply circuit 131b, an input interface circuits 142 and 180, a first switching element 151 serving as a first output interface circuit, and a second switching element 161 serving as a second output interface circuit. The microprocessor 110B cooperates with a nonvolatile program memory 111B, a RAM memory 112 for arithmetic processing, a nonvolatile data memory 113, and a multi-channel A/D converter 114.

Main voltage dividing circuits 132a and 133a are connected in series and include voltage dividing resistors fed with the voltage from a main power supply terminal Vb. The voltage across the voltage dividing resistor 133a is supplied as a first dividing voltage An1 to an analog input port of the microprocessor 110B and inputted to a negative side terminal of a comparator circuit 126.

Comparison voltage dividing circuits 124 and 125 are connected in series and include voltage dividing resistors fed with the voltage from an instruction power supply terminal Vs. A voltage across the voltage dividing resistor 125 is inputted as a third dividing voltage An3 to a positive side terminal of the comparator circuit 126. A comparison determination output CMP of the comparator circuit 126 is inputted to the microprocessor 110B.

A self-hold instruction signal DR for a driving transistor 135 for energizing an exciting coil 103c of the power supply relay 103 is outputted from a watchdog timer 170. The watchdog timer 170 monitors a pulse width of a watchdog clear signal WD generated by the microprocessor 110B. When the pulse width is excessive, a reset signal RS is generated to initialize and reactivate the microprocessor 110B. On the other hand, when the watchdog clear signal WD is normal, the self-hold instruction signal DR is generated to hold the turn-on state of the driving transistor 135.

In the on-vehicle electronic control device 100B having the structure described above, when the power supply switch 102 is closed, a base current flows into the driving transistor 135 through a driving resistor 121 and a diode 122, and hence the driving transistor 135 is turned on to energize the exciting coil 103c. As a result, an output contact 103a is closed to feed the voltage to the main power supply circuit 131a.

When the main power supply circuit 131a generates a control power supply voltage Vcc, the microprocessor 110B activates. Then, when the watchdog timer 170 generates a self-hold instruction signal DR, the base current is supplied to the driving transistor 135 through a driving resistor 137 and a diode 136. As a result, even when the power supply switch 102 is opened, the exciting coil 103c continues to be energized until the self-hold instruction signal DR is stopped.

The activated microprocessor 110B drive-controls the first electrical load 105 and the second electrical load 106 based on an operating state of the switching sensor 104, a level of an output voltage of the analog sensor 108, and contents of the input and output control programs stored in the nonvolatile program memory 111B.

Figure 4:
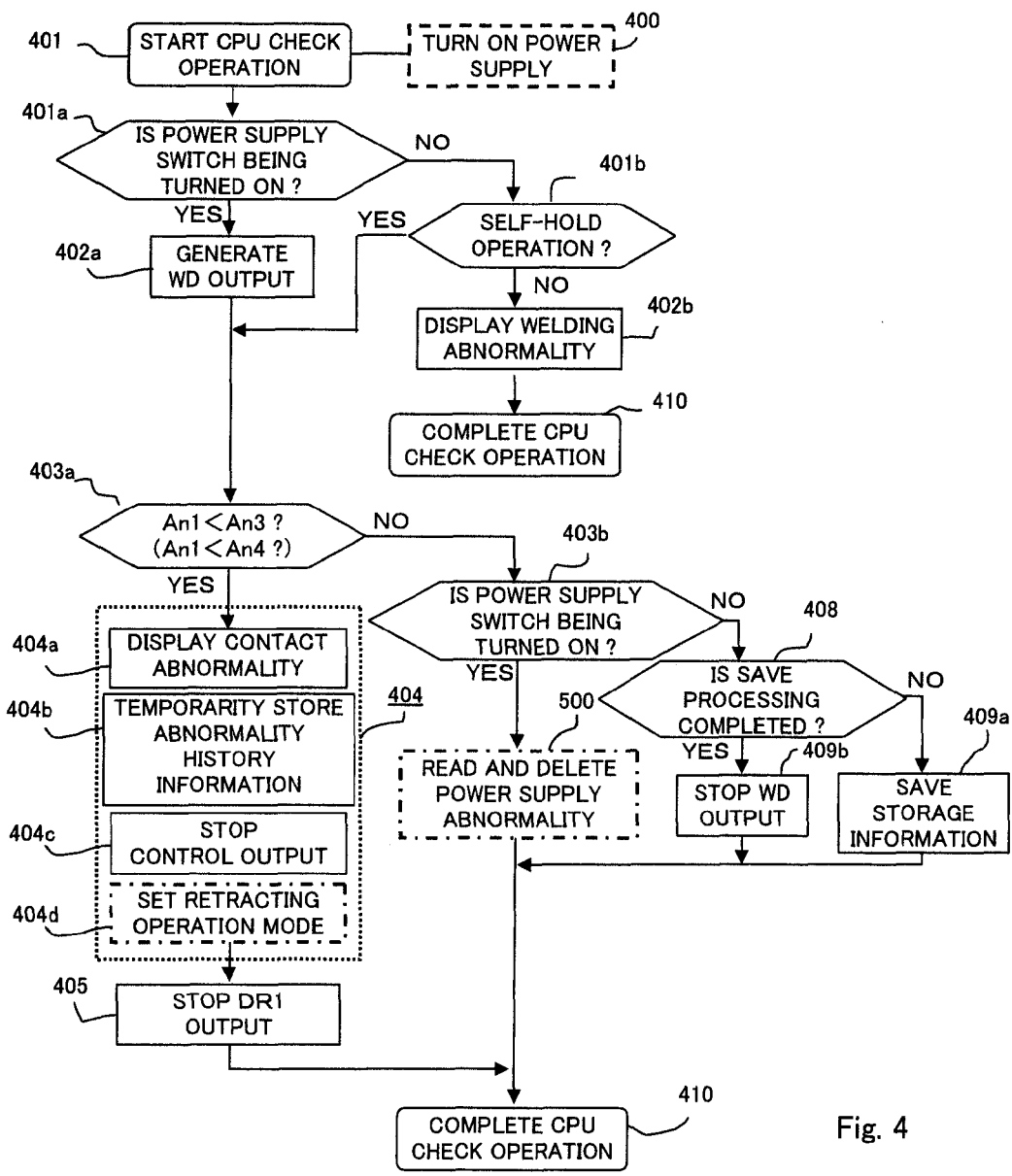
FIG. 4 is a flowchart showing a check operation of the on-vehicle electronic control device according to Embodiment 2 of the present invention.

Next, a check operation of the on-vehicle electronic control device shown in FIG. 3 will be described with reference to a flowchart. FIG. 4 is a flowchart showing the check operation of the on-vehicle electronic control device according to Embodiment 2 of the present invention. Points different from the flowchart of FIG. 2 according to Embodiment 1 will be mainly described below. Note that Steps 400 to 410 in FIG. 4 correspond to Steps 200 to 210 in FIG. 2.

With respect to a first different point, according to Embodiment 1, the microprocessor 110A generates the self-hold instruction signal DR0. In contrast to this, according to Embodiment 2, the watchdog timer 170 generates the self-hold instruction signal DR.

Therefore, the self-hold instruction signal DR0 is set in Step 202a. In contrast to this, in Step 402a, the watchdog clear signal WD is generated. The self-hold instruction signal DR0 is stopped in Step 209b. In contrast to this, in Step 409b, the watchdog clear signal WD is stopped.

With respect to a second different point, according to Embodiment 1, the A/D conversion value of the first dividing voltage An1 is compared with the A/D conversion value of the second dividing voltage An2 by the microprocessor 110A. In contrast to this, according to Embodiment 2, the first dividing voltage An1 is compared with the third dividing voltage An3 by the comparator circuit 126 to input the comparison determination output CMP to the microprocessor 110B.

Therefore, the level relationship between the first dividing voltage An1 and the second dividing voltage An2 is determined in Step 203a. In contrast to this, in Step 403a, the determination result obtained by comparing the first dividing voltage An1 with the third dividing voltage An3 is read.

Each of the second dividing voltage An2 and the third dividing voltage An3 is used to measure the power supply voltage of the on-vehicle battery 101. Each of Step 203a and Step 403a serves as the bypass detection means.

With respect to a third different point, according to Embodiment 1, the first control output signal DR1 is generated in Step Block 205 serving as the bypass measure means. In contrast to this, according to Embodiment 2, the stop of the first control output signal DR1 is maintained in Step 405.

As a result, the bypass power feeding is repeated in Embodiment 1. In contrast to this, in Embodiment 2, the bypass power feeding is maintained. Then, when the power supply switch 102 is opened, the power feeding is stopped.

Therefore, Step 204b serves as the abnormality history storing means for the data memory 113. In contrast to this, the abnormality occurrence state is temporarily stored in the RAM memory 112 in Step 404b. The abnormality history is stored in the data memory 113 in Step 409a. Steps corresponding to Steps 206 and 207 of FIG. 2 are not present in FIG. 4 and thus processing following Step 405 goes to Operation Completion Step 410.

With respect to a fourth different point, although the control output is stopped in each of Steps 204c and 404c, Step 404d is newly added in FIG. 4. In Step 404d, processing can go to a save operation mode and the detail thereof will be described later in Embodiment 3 with reference to FIG. 5.

Step 500 serving as power supply failure read/delete means associated with a power supply failure storage circuit 128 shown in FIG. 5 as described later is added. Step 500 is executed after the determination of YES is made in Step 403b. Then, processing goes to Operation Completion Step 410.

The power supply failure read/delete means (Step 500) is executed when the power feeding to a microprocessor 110C according to Embodiment 3 described later restarts. To be more specific, the power supply failure read/delete means (Step 500) reads out an abnormality storage state from the power supply failure storage circuit 128, causes the RAM memory 112 to temporarily store the abnormality storage state, and resets the abnormality storage state of the power supply failure storage circuit 128 at the time of the completion of the readout and storage. Immediately after the power supply switch 102 is opened, the power supply failure information temporarily stored in the RAM memory 112 is transferred to the nonvolatile data memory 113 and stored therein.

As is apparent from the above description, the on-vehicle electronic control device (100B) according to Embodiment 2 is the power supply abnormality detection circuit for the on-vehicle electronic control device (100B) which includes the nonvolatile program memory (111B) in which the control program is stored, the input interface circuit (142, 180) connected with the switching contact (104) or the analog input sensor (108), the first output interface circuit (151) connected with the first electrical load (105), the second output interface circuit (161) connected with the second electrical load (106), the microprocessor (110B) which controls the first electrical load (105) and the second electrical load (106) based on the content of the control program stored in the nonvolatile program memory (111B) and the operating state of the switching contact (104) or the input sensor (108), and the main power supply circuit (131a) which is fed with power from the on-vehicle battery (101) through the output contact (103a) of the power supply relay (103) and the main power supply terminal (Vb) of the connector and which supplies the stabilized control power supply voltage (Vcc) to the microprocessor (110B). The control program serves as bypass detection means (Step 403a), abnormality processing means (Step 404), and bypass measure means (Step 405) to operate the microprocessor.

The first electrical load (105) is connected between the output contact (103a) of the power supply relay (103) and the first switching element (151) serving as the first output interface circuit, to be subjected to power feed control in response to the switching of the first switching element (151). The first switching element (151) is also connected in parallel with a commutation diode (154) through which a load current of the first electrical load (105) from the main power supply terminal (Vb) returns when the first switching element (151) is opened.

The second electrical load (106) is connected between the output contact (103a) of the power supply relay (103) and the second switching element (161) serving as the second output interface circuit, to be subjected to power feed control in response to the switching of the second switching element (161). The second switching element (161) is also connected in parallel with a constant-voltage diode (162) for rapidly reducing a load current of the second electrical load (106) when the second switching element (161) is opened.

The bypass detection means (Step 403a) detects that an input voltage to the main power supply circuit (131a) is a voltage lower than the power supply voltage of the on-vehicle battery (101), to thereby detect the state in which the main power supply circuit (131a) is fed with bypass power from the output contact (103a) of the power supply relay (103) through the first electrical load (105) and the commutation diode (154) because of the contact failure of the main power supply terminal (Vb).

The abnormality processing means (Step 404) operates when the bypass detection means (Step 403a) detects the bypass power fed state, reports the abnormality or causes a storage portion to store abnormality occurrence history information, and stops at least a part of the control output.

The bypass measure means (Step 405) operates when the bypass detection means (Step 403a) detects the bypass power fed state, and closes the first switching element (151) or holds the opened state.

The on-vehicle electronic control device (100B) according to Embodiment 2 further includes: the driving transistor (135) turned on in response to the control current from the on-vehicle battery (101) through the power supply switch (102) and the instruction power supply terminal (Vs) of the connector to energize the exciting coil (103c) of the power supply relay (103); and the bypass detection circuit section having main voltage dividing circuits (132a and 133a), comparison voltage dividing circuits (132b and 133b), and a comparator circuit (126).

The driving transistor (135) is turned on when the power supply switch (102) is closed. The turn-on state is held based on the self-hold instruction signal (DR) outputted when the power supply relay (103) is energized to start the operation of the microprocessor (110B). Therefore, even when the power supply switch (102) is opened, the power supply relay (103) continues to be in the energization state until the self-hold instruction signal (DR) is stopped.

The main voltage dividing circuits (132a and 133a) divide the applied voltage to the main power supply terminal (Vb) to generate the first dividing voltage (An1). The comparison voltage dividing circuits (132b and 133b) divide the applied voltage to the instruction power supply terminal (Vs) to generate the third dividing voltage (An3). The comparator circuit (126) outputs, to the microprocessor (110B), the determination result obtained by comparing the first dividing voltage (An1) with the third dividing voltage (An3).

When the third dividing voltage (An3) exceeds the first dividing voltage (An1), the bypass detection means (Step 403a) detects the bypass power fed state resulting from the contact failure of the main power supply terminal (Vb) based on the determination result obtained by comparing by the comparator circuit (126).

When the structure as described above is provided, the applied voltage to the main power supply terminal can be compared with the applied voltage to the instruction power supply terminal by the compartor circuit to input the result obtained by comparison to the microprocessor, thereby detecting the occurrence of the bypass power fed state. Therefore, a control burden to the microprocessor can be reduced and accurate voltage comparison can be performed using the simple hardware structure to detect the bypass power fed state.

The on-vehicle electronic control device (100B) according to Embodiment 2 is an engine control device including at least one of fuel injection control means and ignition control means. The bypass measure means (Step 405) operates when the bypass detection means (Step 403a) detects the bypass power fed state, and stops the first control output signal (DR1) for closing the first switching element (151) to continue the bypass power feeding through the first electrical load (105).

The abnormality processing means (Step 404) operates when the bypass detection means (Step 403a) detects the bypass power fed state, and stops the generation of at least one of a drive control output signal for an electromagnetic valve for fuel injection and a drive control output signal for an ignition coil.

According to the structure as described above, when the bypass power fed state is detected, the stopping of the driving of the first electrical load can be maintained to hold the bypass power fed state, and the fuel injection control or the ignition control can be stopped to ensure an engine stop state. Therefore, while the safe stop state is ensured, the warning indicator can be continuously operated to reliably report the abnormality.

The on-vehicle electronic control device (100B) according to Embodiment 2 further includes the RAM memory (112) for arithmetic processing. The abnormality processing means (Step 404) includes the abnormality history storing means for storing, as the abnormality occurrence history information, the fact that the bypass detection means (Step 403a) has detected the bypass power fed state, in the nonvolatile data memory (113).

The abnormality history storing means (Step 409a) transfers, to the nonvolatile data memory (113), the abnormality occurrence information temporarily stored in the RAM memory (112) immediately after the power supply switch (102) is turned off, to be stored as the abnormality occurrence history information in the nonvolatile data memory (113), and stores the cumulative addition value of the number of effective occurrence of the bypass power feeding.

When the structure as described above is provided, the number of occurrence of the bypass power fed state can be stored in the nonvolatile data memory immediately after the stop of the operation. Therefore, the number of data rewriting into the nonvolatile data memory can be reduced. Necessary information including other learning storage information is transferred to the nonvolatile data memory during the engine stop state, and hence the control burden to the microprocessor can be reduced.

The on-vehicle electronic control device (100B) according to Embodiment 2 further includes: the driving transistor (135) turned on in response to a control current from the on-vehicle battery (101) through the power supply switch (102) and the instruction power supply terminal (Vs) of the connector to energize the exciting coil (103c) of the power supply relay (103); and the nonvolatile data memory (113) cooperating with the microprocessor (110B). The control program further serves as welding abnormality detection means (Step 402b) to operate the microprocessor (110B).

The driving transistor (135) is turned on when the power supply switch (102) is closed. The turn-on state is held based on the self-hold instruction signal (DR) outputted when the power supply relay (103) is energized to start the operation of the microprocessor (110B). Therefore, even when the power supply switch (102) is opened, the power supply relay (103) continues to be in the energization state until the self-hold instruction signal (DR) is stopped.

In a state where the power supply switch (102) is opened applying no power supply voltage to the instruction power supply terminal (Vs) and the self-hold instruction signal (DR) is stopped, welding abnormality detection means (Step 402b) detects that the power supply voltage is applied to the main power supply terminal (Vb), to thereby detect the welding abnormality of the output contact of the power supply relay (103) or the power supply short-circuit abnormality in which an output wiring circuit makes contact with the power supply line of the on-vehicle battery (101), and reports the abnormality using the warning indicator based on a result obtained by detecting the abnormality or causes the nonvolatile data memory (113) to store, as the abnormality occurrence information, the result obtained by detecting the abnormality.

According to the structure as described above, when the power supply voltage is being applied to the main power supply terminal while the exciting coil of the power supply relay is de-energized, the welding abnormality of the output contact of the power supply relay or the power supply short-circuit abnormality of the power supply wiring can be determined. Therefore, the report of the abnormality or the storage of the abnormality occurrence information can be easily performed by the microprocessor.

Embodiment 3

Figure 5:
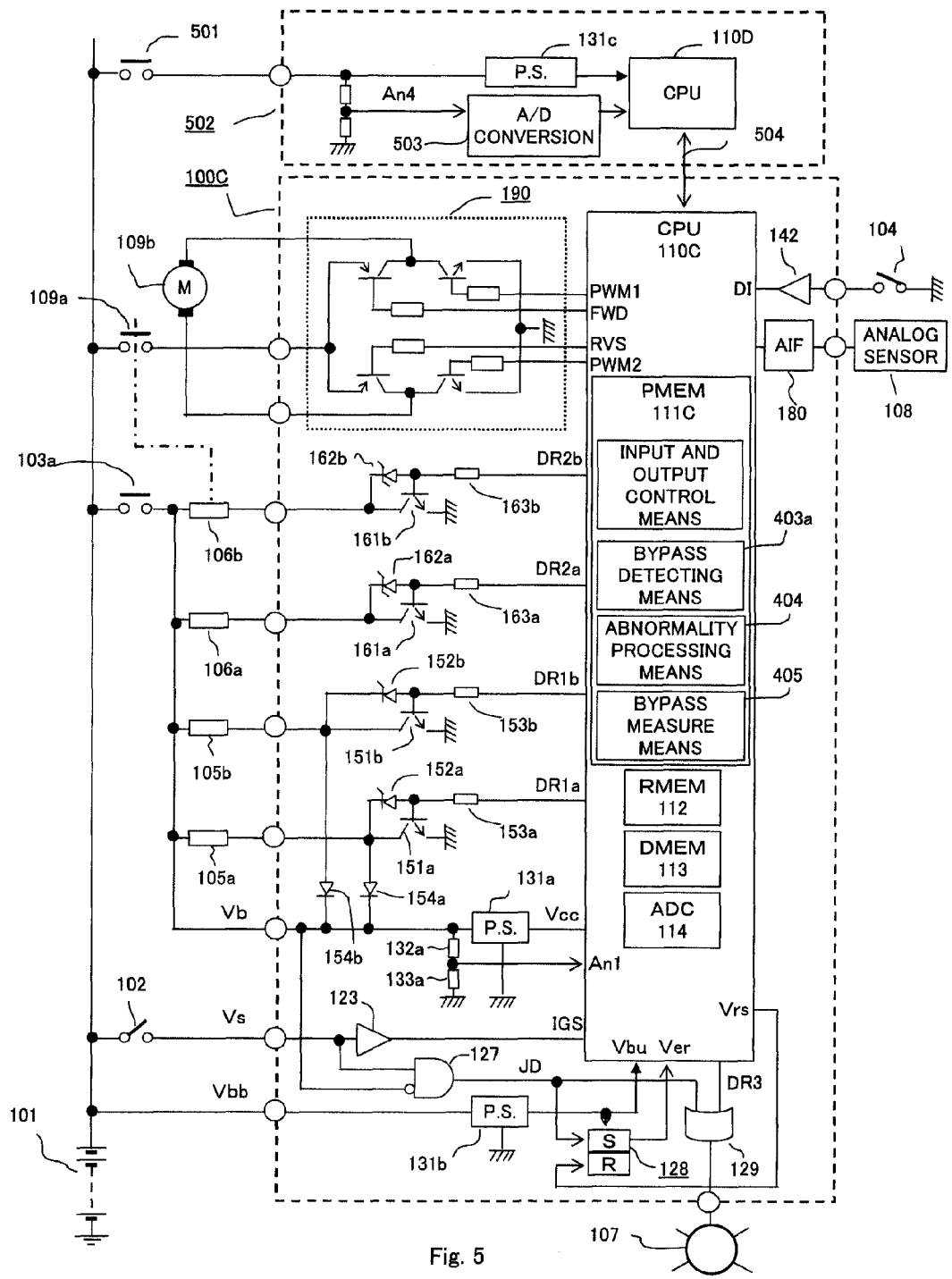
FIG. 5 is a partial structural diagram showing an on-vehicle electronic control device according to Embodiment 3 of the present invention.

FIG. 5 is a partial structural diagram showing an on-vehicle electronic control device according to Embodiment 3 of the present invention. Points different from the structure of FIG. 3 according to Embodiment 2 will be mainly described below. Note that the reference symbols in each drawing indicate the same or corresponding portions. Further, the flowchart shown in FIG. 4, which has been used to describe Embodiment 2, will be used for convenience.

In FIG. 5, an on-vehicle electronic control device 100C includes a microprocessor 110C as a main part. A power supply relay 103 (not shown), a switching sensor 104, and an analog sensor 108 are provided outside the on-vehicle electronic control device 100C and connected with one another.

A plurality of first electrical loads 105a and 105b are, for example, a pair of variable valve timing controlling solenoids. A second electrical load 106a is a solenoid for driving an electromagnetic valve for fuel injection. A second electrical load 106b is a load power supply relay having an output contact 109a. The output contact 109a is connected with a power supply circuit for a throttle valve driving motor 109b.

With respect to the second electrical load 106a for the electromagnetic valve for fuel injection, a plurality of electromagnetic valves are normally used corresponding to the number of cylinders of the engine and a plurality of second switching elements 161a are used corresponding to the number of electromagnetic valves.

In a combined on-vehicle electronic control device 502 fed with power from an on-vehicle battery 101 when a power supply switch 501 is closed, a fourth dividing voltage An4 obtained by dividing the power supply voltage of the on-vehicle battery 101 is transmitted to the microprocessor 110C through an A/D converter 503 and a microprocessor 110D by a communication line 504.

When the on-vehicle electronic control device 100C is an engine control device, the combined on-vehicle electronic control device 502 is, for example, a variable speed control device for an automatic transmission, and both the devices communicate a large number of control signals with each other through the communication line 504.

As in the case of FIG. 3 according to Embodiment 2 described above, the on-vehicle electronic control device 100C includes a microprocessor 110C, a main power supply circuit 131a, an auxiliary power supply circuit 131b, an interface circuit 123 for a power supply switch 102, and input interface circuits 142 and 180, which are connected with one another. The microprocessor 110C cooperates with a non-volatile program memory 111 C, a RAM memory 112 for arithmetic processing, a nonvolatile data memory 113, and a multi-channel A/D converter 114.

A first switching element 151a (151b) serving as a first output interface circuit includes a power transistor for driving a first electrical load 105a (105b). A constant-voltage diode 152a (152b) whose operating voltage is larger than a maximum power supply voltage of the on-vehicle battery 101 is connected between a collector terminal and a base terminal of the power transistor. The base terminal of the power transistor is connected with a first control output terminal DR1a (DR1b) of the microprocessor 110C through a driving resistor 153a (153b).

A commutation diode 154a (154b) is connected between a collector terminal of a power transistor 151a (151b) and the main power supply terminal Vb and connected in reverse parallel to the first electrical load 105a (105b).

A second switching element 161a (161b) serving as a second output interface circuit includes a power transistor for driving a second electrical load 106a (106b). A constant-voltage diode 162a (162b) whose operating voltage is larger than the maximum power supply voltage of the on-vehicle battery 101 is connected between a collector terminal and a base terminal of the power transistor. The base terminal of the power transistor is connected with a second control output terminal DR2a (DR2b) of the microprocessor 110C through a driving resistor 163a (163b).

A bridge circuit 190 including a pair of upstream side transistors and a pair of downstream side transistors drives a throttle valve driving motor 109b in forward and reverse directions based on rotation direction signals FWD and RVS and pulse width modulation signals PWM1 and PWM2 from the microprocessor 110C.

When the output contact 109a is opened to stop the energization of the throttle valve driving motor 109b, the degree of valve opening of an intake throttle is returned to a small degree of fixed valve opening which is suitable to perform a retracting operation.

In Step 403a of FIG. 4, the first dividing voltage An1 obtained from the main voltage dividing circuits 132a and 133a connected with the main power supply terminal Vb is compared with the fourth dividing voltage An4 obtained from the combined on-vehicle electronic control device 502 by the microprocessor 110C to make a level comparison. When the first dividing voltage An1 is smaller than the fourth dividing voltage An4, the determination is YES and processing goes to Step 404a. On the other hand, when the first dividing voltage An1 is not smaller than the fourth dividing voltage An4, the determination is NO and processing goes to Step 403b.

In Step 404c, a second control output signal DR2b is stopped, and hence the degree of valve opening of the throttle is returned to a small degree of fixed valve opening. In Step 404d, the retracting operation (limp home operation) of a vehicle is performed during fuel injection control based on the second control output signal DR2b.

The second electrical load 106a represents a plurality of fuel injection valves or a plurality of ignition coils. In an actual case, a large number of second electrical loads are controlled.

In an in-cylinder high-pressure injection type on-vehicle electronic control device in which the electromagnetic valve for fuel injection is provided to a cylinder head of the engine, a driving voltage is supplied to the electromagnetic valve for fuel injection through an output contact of a second electrical load 106c (not shown) similar to the second electrical load 106b. A high-voltage generation circuit for rapid driving is provided in the on-vehicle electronic control device 100C.

When the plurality of first electrical loads 105a and 105b are provided, in order to perform the bypass power feeding on the main power supply circuit 131a, one or both of the first switching elements 151a and 151b is desirably set to the opened state.

When the repetitive bypass power feeding is to be performed as in Embodiment 1 described earlier, both the first switching elements 151a and 151b are desirably closed to shut off power.

The power supply failure determination circuit 127 includes an AND circuit for detecting a state in which the power supply voltage is applied to the instruction power supply terminal Vs and the power supply voltage is not applied to the main power supply terminal Vb, to generate a logical determination output for determining whether the output contact 103a of the power supply relay 103 is in the opened state or an output wiring is in a broken state.

The power supply failure storage circuit 128 is a flip-flop circuit which is set when the power supply failure determination circuit 127 determines the power supply abnormality. The flip-flop circuit operates at a backup power supply voltage Vbu which is an output voltage of the auxiliary power supply circuit 131b.

When the power feeding to the microprocessor 110C restarts, The power supply failure read/delete means shown in Step 500 of FIG. 4 is executed. To be more specific, the power supply failure read/delete means (Step 500) reads out the abnormality storage state from the power supply failure storage circuit 128, causes the RAM memory 112 to temporarily store the abnormality storage state, and resets the abnormality storage state of the power supply failure storage circuit 128 with the completion of the readout and storage. Immediately after the power supply switch 102 is opened, the abnormality storage state temporarily stored on the RAM memory 112 is transferred to the nonvolatile data memory 113 and stored therein.

An OR circuit 129 operates when the power supply failure determination circuit 127 generates a logical output indicating the determination of the power supply abnormality or when the microprocessor 110C generates an abnormality warning output signal DR3, thereby driving the warning indicator 107. The power supply failure determination circuit 127 and the OR circuit 129 operate in response to the power supply voltage applied to the instruction power supply terminal Vs.

The bypass detection means can be changed such that the first dividing voltage An1 and the third dividing voltage An3 as described with reference to FIG. 3 in Embodiment 2 are used instead of the first dividing voltage An1 and the second dividing voltage An2 as described with reference to FIG. 1 in Embodiment 1.

In contrast to this, the bypass detection means can be changed such that the first dividing voltage An1 and the second dividing voltage An2 as described with reference to FIG. 1 in Embodiment 1 are used instead of the first dividing voltage An1 and the third dividing voltage An3 as described with reference to FIG. 3 in Embodiment 2.

When another combined on-vehicle electronic control device is serially connected with the on-vehicle electronic control devices 100A and 100B and fed with power from the on-vehicle battery 101, the following method is expected. The power supply voltage of the on-vehicle battery 101 is measured by the combined on-vehicle electronic control device and the measured voltage is serially communicated to the on-vehicle electronic control devices 100A and 100B. Therefore, the measured voltage can be used as an alternative signal to the second dividing voltage An2 and the third dividing voltage An3.

The self-hold instruction signal DR of FIG. 3 according to Embodiment 2 can be used instead of the self-hold instruction signal DR0 of FIG. 1 according to Embodiment 1. In contrast to this, the self-hold instruction signal DR0 of FIG. 1 according to Embodiment 1 can be used instead of the self-hold instruction signal DR of FIG. 3 according to Embodiment 2. When an abnormality determination/check operation step is added to the bypass detection means (Step 203a) of FIG. 2 or the bypass detection means (Step 403a) of FIG. 4, the occurrence of a determination error due to a false operation caused by noise can be prevented.

Immediately after the start of operation of the on-vehicle electronic control devices 100A and 100B, the following is possible. The generation of the first control output signal DR1 is stopped until the detection of the occurrence or absence of the bypass abnormality which is performed by the bypass detection means (Steps 203a and 403a) is completed. When the bypass abnormality is detected, the generation of the first control output signal DR1 is continuously stopped. When the bypass abnormality is not detected, the generation of the first control output signal DR1 is enabled.

In addition, for each of the first switching elements 151a and 151b and the second switching elements 161a and 161b which are shown, a field effect power transistor is used instead of a junction type power transistor. In fact, a transistor module having an overvoltage protection function and an overcurrent protection function is used.

The vehicle can be grounded through a conductive base of a sealed case (not shown) storing the on-vehicle electronic control devices 100A and 100B instead of the ground terminal GND.

Next, the check operation of the on-vehicle electronic control device as shown in each of FIGS. 3 and 5 will be described again in detail with reference to the flowchart of FIG. 4 which is used in Embodiment 2.

In Step 400 shown in FIG. 4, the power supply switch 102 is closed to feed the on-vehicle electronic control devices 100B and 100C with power from the on-vehicle battery 101. In subsequent Step 401, the main power supply circuit 131a generates the stabilized control power supply voltage Vcc to activate the microprocessors 110B and 110C. Each of the microprocessors 110B and 110C starts a power supply voltage check operation.

In subsequent Step 401a, each of the microprocessor 110B and 110C monitors a power supply turn-on instruction signal IGS to determine whether or not the power supply switch 102 is continuously being closed. When the power supply switch 102 is being closed and thus the determination is YES, processing goes to Step 402a. On the other hand, when the power supply switch 102 is being opened and thus the determination is NO, processing goes to Step 401b.

In Step 401b, each of the microprocessors 110B and 110C determines whether or not a self-hold operation is being performed in Step 402a described later. When the self-hold operation is being performed and thus the determination is YES, processing goes to Step 403a. On the other hand, when the self-hold instruction signal DR is stopped in Step 409b described later and thus the determination is NO, processing goes to Step 402b.

In Step 402a, each of the microprocessors 110B and 110C starts to generate the watchdog clear signal WD. With the generation of the watchdog clear signal WD, the watchdog timer 170 generates the self-hold instruction signal DR. Therefore, even when the power supply switch 102 is being opened, the driving transistor 135 is turned on through the driving resistor 137 and the diode 136 until the self-hold instruction signal DR is stopped in Step 409b described later, thereby maintaining the operation of the power supply relay 103 (see FIG. 3).

It is determined in Step 401a that the power supply switch 102 is in the opened state and it is determined in Step 401b that the self-hold instruction signal DR is in a stopped state. However, when the power feed state still continues, Step 402b is executed. In Step 402b, each of the microprocessors 110B and 110C determines a welding abnormality of the output contact 103a of the power supply relay 103 or a power supply short-circuit abnormality in which the main power supply terminal Vb makes contact with a power supply line of the on-vehicle battery 101. Each of the microprocessors 110B and 110C causes the warning indicator 107 to report the abnormality or causes the data memory 113 to store the abnormality occurrence information. After that, processing goes to Operation Completion Step 410.

In Step 403a, each of the microprocessors 110B and 110C compares the first dividing voltage An1 with the fourth dividing voltage An4 transmitted from the combined on-vehicle electronic control device 502, to obtain a level difference between the voltage of the main power supply terminal Vb and the power supply voltage of the on-vehicle battery 101. For example, each of the microprocessors 110B and 110C determines whether or not the bypass power fed state occurs because of the contact failure of the main power supply terminal Vb, based on whether or not the difference value is equal to or larger than 2.12 V.

Step 403a corresponds to processing performed by the bypass detection means. In Step 403a, when the bypass power fed state occurs and thus the determination is YES, processing goes to Step 404a. When the bypass power fed state does not occur and thus the determination is NO, processing goes to Step 403b.

In the case of the embodiment shown in FIG. 3, the level comparison is performed by the comparator circuit 126. Therefore, in Step 403a, each of the microprocessors 110B and 110C monitors the comparison determination output CMP of the comparator circuit 126 to determine the level comparison.

In Step 403b, each of the microprocessors 110B and 110C determines again whether or not the power supply switch 102 is being closed. When the power supply switch 102 is being closed and thus the determination is YES, processing goes to Operation Completion Step 410 via Step 500. When the power supply switch 102 is being opened and thus the determination is NO, processing goes to Step 408.

Next, Step Block 404 corresponding to the abnormality processing means will be described. This Step Block 404 includes Step 404a corresponding to the abnormality warning means, Step 404b corresponding to abnormality history temporarily-storing means, Step 404c corresponding to control output stopping means, and Step 404d corresponding to retracting operation selecting means.

In Step 404a, each of the microprocessors 110B and 110C causes the warning indicator 107 to report a contact abnormality of the main power supply terminal Vb. In subsequent Step 404b, each of the microprocessors 110B and 110C writes the abnormality occurrence information onto the RAM memory 112.

In subsequent Step 404c, each of the microprocessors 110B and 110C stops at least one of a fuel injection control output and an ignition coil drive control output in the first electrical load 105 and the second electrical load 106 in the case of the embodiment of FIG. 3. In the case of the embodiment of FIG. 5, first control output signals DR1a and DR1b and the second control output signal DR2b are stopped. Therefore, the power feeding to the throttle valve driving motor 109b is stopped to return the degree of valve opening to a small degree of fixed throttle valve opening.

In Step 404d, each of the microprocessors 110B and 110C executes the fuel injection control and the ignition control based on the degree of fixed throttle valve opening to perform a low-speed retracting operation.

Next, Step 405 corresponding to the bypass measure means will be described. In Step 405, each of the microprocessors 110B and 110C maintains the stop of the first control output signals DR1, DR1a, and DR1b which have been stopped in Step 404c to continue the bypass power feeding. Processing following Step 405 goes to Operation Completion Step 410.

When the main power supply terminal Vb has preferable contact and a normal state is determined in Step 403a, processing goes to Step 403b. In Step 403b, each of the microprocessors 110B and 110C determines a state of the power supply switch 102. In Step 403b, when an opened state of the power supply switch 102 is detected and thus the determination is NO, processing goes to Step 408.

In Step 408, each of the microprocessors 110B and 110C determines whether or not learning storage information and other abnormality occurrence information which are written onto the RAM memory 112 are transferred to the data memory 113 and saved thereon. When no saving is performed, the determination is NO and processing goes to Step 409a. On the other hand, when the saving is completed, the determination is YES and processing goes to Step 409b.

In Step 409a, each of the microprocessors 110B and 110C executes transfer and save processing. In Step 409b, the watchdog clear signal WD is stopped to stop the self-hold instruction signal DR. After the execution of Step 409a or Step 409b, processing goes to Operation Completion Step 410.

In Step 409a corresponding to the abnormality history storing means, each of the microprocessors 110B and 110C reads out the abnormality occurrence count information already stored on the data memory 113 and adds one to the read/write number to overwrite the resultant.

In Step 500 corresponding to the power supply failure read/delete means, each of the microprocessors 110B and 110C reads out the abnormality storage state from the power supply failure storage circuit 128 and causes the RAM memory 112 to temporarily store the abnormality storage state. Then, each of the microprocessors 110B and 110C resets the abnormality storage state of the power supply failure storage circuit 128 with the completion of the readout and storage. The abnormality storage state temporarily stored on the RAM memory 112 is transferred to the nonvolatile data memory 113 and stored thereon in Step 409a.

In Operation Completion Step 410, each of the microprocessors 110B and 110C executes another control operation. After a lapse of a predetermined period of time, processing goes to Operation Start Step 401 again. However, after the power supply switch 102 is opened and the self-hold instruction signal DR is stopped in Step 409b, the power supply relay 103 is de-energized to stop the power feeding to each of the microprocessors 110B and 110C.

As is apparent from the above description, in the on-vehicle electronic control device (100C) according to Embodiment 3, there is provided the power supply abnormality detection circuit for the on-vehicle electronic control device (100C) which includes the nonvolatile program memory (111C) on which the control program is stored, the input interface circuits (142 and 180) connected with the switching contact (104) or the analog input sensor (108), the first output interface circuits (151a and 151b) connected with the first electrical loads (105a and 105b), the second output interface circuits (161a and 161b) connected with the second electrical loads (106a and 106b), the microprocessor (110C) which controls the first electrical loads (105a and 105b) and the second electrical loads (106a and 106b) based on the content of the control program stored on the nonvolatile program memory (111C) and the operating state of the switching contact (104) or the input sensor (108), and the main power supply circuit (131a) which is fed with power from the on-vehicle battery (101) through the output contact (103a) of the power supply relay (103) and the main power supply terminal (Vb) of the connector and which supplies the stabilized control power supply voltage (Vcc) to the microprocessor (110C). The control program serves as the bypass detection means (Step 403a), the abnormality processing means (Step 404), and bypass measure means (Step 405) to operate the microprocessor (110C).

The first electrical loads (105a and 105b) are connected between the output contact (103a) of the power supply relay (103) and the first switching elements (151a and 151b) serving as the first output interface circuit, to be subjected to power feed control in response to the switching of the first switching elements (151a and 151b). The first electrical loads (105a and 105b) are connected in parallel with the commutation diodes (154a and 154b) through which a load current of the first electrical loads (105a and 105b) through the main power supply terminal (Vb) returns when the first switching elements (151a and 151b) are opened.

The second electrical loads (106a and 106b) are connected between the output contact (103a) of the power supply relay (103) and the second switching elements (161a and 161b) serving as the second output interface circuit, to be subjected to power feed control in response to the switching of the second switching elements (161a and 161b). The second switching elements (161a and 161b) are connected in parallel with the constant-voltage diodes (162a and 162b) for rapidly reducing a load current of the second electrical loads (106a and 106b) when the second switching elements (161a and 161b) are opened.

The bypass detection means (Step 403a) detects that an input voltage to the main power supply circuit (131a) is a voltage lower than the power supply voltage of the on-vehicle battery (101), to detect the state in which the main power supply circuit (131a) is fed with bypass power from the output contact (103a) of the power supply relay (103) through the first electrical loads (105a and 105b) and the commutation diodes (154a and 154b) because of the contact failure of the main power supply terminal (Vb).

The abnormality processing means (Step 404) operates when the bypass detection means (Step 403a) detects the bypass power fed state, reports the abnormality or causes a storage portion to store abnormality occurrence history information, and stops at least a part of the control output.

The bypass measure means (Step 405) operates when the bypass detection means (Step 403a) detects the bypass power fed state, and closes the first switching elements (151a and 151b) or holds the opened state.

The on-vehicle electronic control device (100C) according to Embodiment 3 is an engine control device including at least one of the intake valve opening degree control means and the fuel injection control means which are used for the intake throttle valve driving motor. The bypass measure means (Step 405) operates when the bypass detection means (Step 403a) detects the bypass power fed state, and stops the first control output signals (DR1a and DR1b) for closing the first switching elements (151a and 151b) to continue the bypass power feeding through the first electrical loads (105a and 105b).

The abnormality processing means (Step 404) operates when the bypass detection means (Step 403a) detects the bypass power fed state, and stops the control output (DR2b) for power feed instruction to the intake throttle valve driving motor to return the degree of valve opening to the degree of fixed throttle valve opening for retracting operation. Therefore, the control based on the fuel injection control is enabled in the bypass power fed state to perform the retracting operation.

According to the structure as described above, when the bypass power fed state is detected, the stopping of the driving of the first electrical load can be maintained to hold the bypass power fed state, and a load power supply relay (second electrical load) serving as a power supply circuit of the motor for controlling the degree of valve opening of the intake throttle can be de-energized to hold the degree of valve opening to a small degree of throttle valve opening. Therefore, while the first electrical load is stopped, other control outputs such as the fuel injection control and the ignition control which are required to drive the engine can be enabled, and hence a reliable retracting operation can be performed.

In the on-vehicle electronic control device (100C) according to Embodiment 3, each of the first electrical loads (105a and 105b) is an electromagnetic valve controlling solenoid load, which is represented by a variable valve timing controlling solenoid, an intake flow controlling solenoid, or a variable intake pipe length controlling solenoid. The solenoid load is a specific electrical load in which the effective operation is not performed by the bypass power feeding to the main power supply circuit (131a) because of an extremely small applied voltage and the retracting operation can be performed even when the solenoid load does not operate in the case of the retracting operation.

When the structure as described above is provided, an electromagnetic valve controlling solenoid in which the effective operation cannot be performed in the bypass power fed state because of an extremely small applied voltage is used as the first electrical load. In addition, even when the first electrical load does not operate, a specific electrical load capable of driving the engine can be used. Therefore, when a reduction in input voltage of the main power supply circuit in the bypass power fed state is suppressed and thus at least the battery voltage is normal, the on-vehicle electronic control device can stably operate, and hence the retracting operation can be reliably performed even when an abnormality occurs in the field.

The on-vehicle electronic control device (100C) according to Embodiment 3 further includes the RAM memory (112) for arithmetic processing. The abnormality processing means (Step 404) includes the abnormality history storing means for storing, as the abnormality occurrence history information, the fact that the bypass detection means (Step 403a) detects the bypass power fed state, on the nonvolatile data memory (113).

The abnormality history storing means (Step 409a) transfers, to the nonvolatile data memory (113), the abnormality occurrence information temporarily stored on the RAM memory (112) immediately after the power supply switch (102) is turned off, to be stored as the abnormality occurrence history information on the nonvolatile data memory (113), and stores the cumulative addition value of the number of effective generation of the bypass power feeding.

When the structure as described above is provided, the number of generation of the bypass power fed state can be stored on the nonvolatile data memory immediately after the stop of the operation. Therefore, the number of data rewriting onto the nonvolatile data memory can be reduced. Necessary information including other learning storage information is transferred to the nonvolatile data memory during the engine stop state, and hence the control burden to the microprocessor can be reduced.

The on-vehicle electronic control device (100C) according to Embodiment 3 further includes: the auxiliary power supply circuit (131b) constantly fed with power from the on-vehicle battery (101) through the auxiliary power supply terminal (Vbb) of the connector; the driving transistor (135) turned on in response to the control current from the on-vehicle battery (101) through the power supply switch (102) and the instruction power supply terminal (Vs) of the connector to energize the exciting coil (103c) of the power supply relay (103); the power supply failure determination circuit (127); the power supply failure storage circuit (128); and the nonvolatile data memory (113) cooperating with the RAM memory (112) for arithmetic processing and the microprocessor (110C). The control program further serves as the power supply failure read/delete means (Step 500) to operate the microprocessor.

Even in a state in which the output contact (103a) of the power supply relay (103) is being opened, the auxiliary power supply circuit (131b) continues the power feeding to the RAM memory (112) to hold a storage state of at least a part of the address area and to feed power to the power supply failure storage circuit (128).

The power supply failure determination circuit (127) detects the state in which the power supply voltage is applied to the instruction power supply terminal (Vs) and the power supply voltage is not applied to the main power supply terminal (Vb) to generate the logical determination output for determining that the output contact (103a) of the power supply relay (103) is in the opened state or the output wiring is in the broken state.

The power supply failure storage circuit (128) is the flip-flop circuit (190) which is set when the logical determination output of the power supply failure determination circuit (127) exhibits the power supply abnormality.

The power supply failure read/delete means (Step 500) is executed when the power feeding to the microprocessor (110C) restarts. The abnormality storage state is read out from the power supply failure storage circuit (128) and is temporarily stored as the power supply failure information in the RAM memory (112). At the same time, the abnormality storage state of the power supply failure storage circuit (128) is reset along with the completion of storage of the power supply failure information. Immediately after the power supply switch (102) is opened, the power supply failure information temporarily stored in the RAM memory (112) is stored in the nonvolatile data memory (113).

With the structure as described above, when the output contact is in the opened state regardless of the energization of the exciting coil of the power supply relay, a generated abnormality can be stored by the power supply failure storage circuit operating with the power supply voltage from the auxiliary power supply circuit, to store the abnormality occurrence state in the nonvolatile data memory along with the restart of the power feeding to the microprocessor. Therefore, the contents of the nonvolatile data memory can be read and checked to determine the presence or absence of the contact abnormality of the output contact of the power supply relay.

The on-vehicle electronic control device (100C) according to Embodiment 3 further includes the OR circuit (129) operating with power fed from the instruction power supply terminal (Vs). The OR circuit (129) operates when the power supply failure determination circuit (127) generates the logical output indicating the determination of the power supply abnormality or when the microprocessor (110C) generates the abnormality warning output signal (DR3), thereby driving the warning indicator (107).

When the structure as described above is provided, the abnormality state in which the microprocessor is not fed with power because of the abnormality of the output contact of the power supply relay can be displayed for warning. Therefore, the fact that the on-vehicle electronic control device is in an inoperable state can be reported to avoid confusion of drivers.

The on-vehicle electronic control device (100C) according to Embodiment 3 further cooperates with the combined on-vehicle electronic control device (502) operating with power fed from the on-vehicle battery (101). The combined on-vehicle electronic control device (502) measures the dividing voltage of the power supply voltage of the on-vehicle battery (101) and transmits the measured voltage as the fourth dividing voltage (An4) to the on-vehicle electronic control device (100C) through the communication line.

The bypass detection circuit section having the main voltage dividing circuits (132a and 133a) and the multi-channel A/D converter (114) is further provided. The main voltage dividing circuits (132a and 133a) divide the voltage applied to the main power supply terminal (Vb) to generate the first dividing voltage (An1). The multi-channel A/D converter (114) performs A/D conversion on the first dividing voltage (An1) and the fourth dividing voltage (An4) and outputs the resultant to the microprocessor (110C).

When the fourth dividing voltage (An4) exceeds the first dividing voltage (An1), the bypass detection means (Step 403a) detects the bypass power fed state resulting from the contact failure of the main power supply terminal (Vb).

When the structure as described above is provided, the voltage applied to the main power supply terminal can be inputted to the microprocessor through the multi-channel A/D converter and is compared in level with the power supply voltage transmitted from the combined on-vehicle electronic control device, thereby detecting the generation of the bypass power fed state. Therefore, the accurate voltage comparison can be performed. In addition, the respective voltage signals are effectively used in the on-vehicle electronic control device and the combined on-vehicle electronic control device for other purposes, where redundant hardware is unnecessary. As a result, the on-vehicle electronic control devices are reduced in size and cost.

In the on-vehicle electronic control device (100C) according to Embodiment 3, before the start of the input and output control performed by the microprocessor (100C), the bypass detection means (Step 403a) causes the first switching elements (151a and 151b) to be in the opened state and then checks the presence or absence of the bypass abnormality.

When the structure as described above is provided, the microprocessor can check the presence or absence of the bypass abnormality before the input and output control. Therefore, it is possible to prevent the microprocessor from causing the abnormal operation which occurs after the first switching elements are carelessly closed in advance.

What is claimed is:

1. A power supply abnormality detection circuit for an on-vehicle electronic control device, comprising:
    a nonvolatile program memory in which a control program is stored;
    an input interface circuit connected with one of a switching contact and an analog input sensor;
    a first output interface circuit connected with a first electrical load;
    a second output interface circuit connected with a second electrical load;
    a microprocessor that controls the first electrical load and the second electrical load based on a content of the control program stored in the nonvolatile program memory and an operating state of the one of the switching contact and the analog input sensor; and
    a main power supply circuit fed with power from an on-vehicle battery through an output contact of a power supply relay and a main power supply terminal of a connector to supply a stabilized control power supply voltage to the microprocessor, wherein:
    the first electrical load is connected between the output contact of the power supply relay and a first switching element serving as the first output interface circuit to be subjected to power feed control in response to switching of the first switching element, and the first switching element is connected in parallel with a commutation diode through which a load current of the first electrical load from the main power supply terminal returns when the first switching element is opened;
    the second electrical load is connected between the output contact of the power supply relay and a second switching element serving as the second output interface circuit to be subjected to power feed control in response to switching of the second switching element, and the second switching element is connected in parallel with a constant-voltage diode for rapidly reducing a load current of the second electrical load when the second switching element is opened;
    the control program serves as bypass detection means, abnormality processing means, and bypass measure means to operate the microprocessor;
    the bypass detection means detects that an input voltage to the main power supply circuit is a voltage lower than a power supply voltage of the on-vehicle battery to detect a bypass power fed state in which the main power supply circuit is fed with bypass power from the output contact of the power supply relay through the first electrical load and the commutation diode because of contact failure of the main power supply terminal;

the abnormality processing means operates when the bypass detection means detects the bypass power fed state, performs one of a report of an abnormality and a storage of abnormality occurrence history information in a storage section, and stops at least a part of a control output; and the bypass measure means operates when the bypass detection means detects the bypass power fed state, and causes one of the first switching element to be closed and the opened state to be held.

2. A power supply abnormality detection circuit for an on-vehicle electronic control device according to claim 1, further comprising:

an auxiliary power supply circuit constantly fed with power from the on-vehicle battery through an auxiliary power supply terminal of the connector;

a bypass detection circuit section including a main voltage dividing circuit, a comparison voltage dividing circuit, and a multi-channel A/D converter; and a RAM memory for arithmetic processing, wherein:

the auxiliary power supply circuit continues power feeding to the RAM memory to hold a storage state of at least a part of an address region even when the output contact of the power supply relay is being opened;

the main voltage dividing circuit divides a voltage applied to the main power supply terminal to generate a first dividing voltage;

the comparison voltage dividing circuit divides a voltage applied to the auxiliary power supply terminal to generate a second dividing voltage;

the multi-channel A/D converter performs A/D conversion on the first dividing voltage and the second dividing voltage and outputs a resultant to the microprocessor; and the bypass detection means detects the bypass power fed state caused by the contact failure of the main power supply terminal when the second dividing voltage exceeds the first dividing voltage.

3. A power supply abnormality detection circuit for an on-vehicle electronic control device according to claim 1, further comprising:

a driving transistor subjected to turn-on control in response to a control current from the on-vehicle battery through a power supply switch and an instruction power supply terminal of the connector to energize an exciting coil of the power supply relay; and a bypass detection circuit section including a main voltage dividing circuit, a comparison voltage dividing circuit, and a comparator circuit, wherein:

the driving transistor is tuned on when the power supply switch is closed, and a turn-on state is held based on a self-hold instruction signal outputted when the power supply relay is energized to start an operation of the microprocessor so that the power supply relay continues to be in an energization state until the self-hold instruction signal is stopped even when the power supply switch is opened;

the main voltage dividing circuit divides a voltage applied to the main power supply terminal to generate a first dividing voltage;

the comparison voltage dividing circuit divides a voltage applied to the instruction power supply terminal to generate a third dividing voltage;

the comparator circuit outputs, to the microprocessor, a determination result obtained through comparison of the first dividing voltage and the third dividing voltage; and the bypass detection means detects the bypass power fed state caused due to the contact failure of the main power supply terminal based on the determination result obtained through the comparison by the comparator circuit when the third dividing voltage exceeds the first dividing voltage.

4. A power supply abnormality detection circuit for an on-vehicle electronic control device according to claim 1, wherein:

the bypass measure means operates when the bypass detection means detects the bypass power fed state, generates a first control output signal for closing the first switching element to turn on the first switching element so that power is fed to the first electrical load, and the first control output signal is stopped when the bypass power feeding to the main power supply circuit is stopped to reset the microprocessor, restarts the bypass power feeding from the first electrical load to the main power supply circuit through the commutation diode, and repeats the same operation based on a result obtained by detecting the bypass power fed state; and the abnormality processing means stops generation of a second control output signal for closing at least the second switching element while the bypass measure means repeatedly operates.

5. A power supply abnormality detection circuit for an on-vehicle electronic control device according to claim 4, wherein the bypass measure means further includes duty control means that sets a non-operating time so that a ratio between the non-operating time and a power feed time at which the microprocessor generates the first control output signal after a lapse of a predetermined non-operating time upon start of operation made by the bypass power feeding, the first electrical load is fed with power by generating the first control output signal, and the first control output signal is stopped by a stop of the bypass power feeding becomes a short-time power feed ratio at which the first electrical load cannot effectively operate.

6. A power supply abnormality detection circuit for an on-vehicle electronic control device according to claim 4, wherein:

the abnormality processing means includes abnormality history storing means that stores, as abnormality occurrence history information, a fact that the bypass detection means detects the bypass power fed state in a nonvolatile data memory; and the abnormality history storing means avoids operating in response to a repetitive operation of the bypass power feeding, and causes the nonvolatile data memory to store the abnormality occurrence history information and a cumulative addition value of the number of effective generation of the bypass power feeding only when first bypass power feeding is generated after the power supply switch is turned on.

7. A power supply abnormality detection circuit for an on-vehicle electronic control device according to claim 1, wherein:

the on-vehicle electronic control device comprises an engine control device including at least one of fuel injection control means and ignition control means;

the bypass measure means operates when the bypass detection means detects the bypass power fed state, and stops a first control output signal for closing the first switching element to continue the bypass power feeding through the first electrical load; and the abnormality processing means operates when the bypass detection means detects the bypass power fed state, and stops generation of at least one of a drive control output signal for an electromagnetic valve for fuel injection and a drive control output signal for an ignition coil.

8. A power supply abnormality detection circuit for an on-vehicle electronic control device according to claim 1, wherein:

the on-vehicle electronic control device comprises an engine control device including at least intake valve opening degree control means and fuel injection control means for an intake throttle valve driving motor;

the bypass measure means operates when the bypass detection means detects the bypass power fed state, and stops a first control output signal for closing the first switching element to continue the bypass power feeding through the first electrical load; and the abnormality processing means operates when the bypass detection means detects the bypass power fed state, and stops a control output for power feed instruction to the intake throttle valve driving motor to return a degree of valve opening to a degree of fixed throttle valve opening for retracting operation so that control based on fuel injection control is enabled in the bypass power fed state to perform the retracting operation.

9. A power supply abnormality detection circuit for an on-vehicle electronic control device according to claim 8, wherein:

the first electrical load comprises an electromagnetic valve controlling solenoid load represented by one of a variable valve timing controlling solenoid, an intake flow controlling solenoid, and a variable intake pipe length controlling solenoid; and the solenoid load comprises a specific electrical load in which an effective operation is not performed by the bypass power feeding to the main power supply circuit because of an extremely small applied voltage and the retracting operation can be performed even when the solenoid load does not operate in the retracting operation.

10. A power supply abnormality detection circuit for an on-vehicle electronic control device according to claim 7, further comprising a RAM memory for arithmetic processing, wherein:

the abnormality processing means includes abnormality history storing means that stores, as the abnormality occurrence history information, a fact that the bypass detection means detects the bypass power fed state in a nonvolatile data memory; and the abnormality history storing means transfers, to the nonvolatile data memory, abnormality occurrence information temporarily stored in the RAM memory immediately after the power supply switch is turned off to be stored as the abnormality occurrence history information in the nonvolatile data memory, and stores the cumulative addition value of the number of effective generation of the bypass power feeding.

11. A power supply abnormality detection circuit for an on-vehicle electronic control device according to claim 1, further comprising:

a driving transistor subjected to turn-on control in response to a control current from the on-vehicle battery through the power supply switch and an instruction power supply terminal of the connector to energize an exciting coil of the power supply relay; and a nonvolatile data memory cooperated with the microprocessor, wherein:

the control program further serves as welding abnormality detection means to operate the microprocessor;

the driving transistor is turned on when the power supply switch is closed, and a turn-on state thereof is held based on a self-hold instruction signal outputted when the power supply relay is energized to start an operation of the microprocessor so that the power supply relay continues to be in an energization state until the self-hold instruction signal is stopped even when the power supply switch is opened; and the welding abnormality detection means detects, when the power supply switch is opened to apply no power supply voltage to the instruction power supply terminal and the self-hold instruction signal is being stopped, that the power supply voltage is applied to the main power supply terminal to detect one of a welding abnormality of the output contact of the power supply relay and a power supply short-circuit abnormality in which an output wiring circuit makes contact with a power supply line of the on-vehicle battery, and performs one of a report of an abnormality to a warning indicator based on a result obtained by detecting the abnormality and a storage of the result obtained by detecting the abnormality in the nonvolatile data memory as abnormality occurrence information.

12. A power supply abnormality detection circuit for an on-vehicle electronic control device according to claim 1, further comprising:

an auxiliary power supply circuit constantly fed with power from the on-vehicle battery through an auxiliary power supply terminal of the connector;

a driving transistor subjected to turn-on control in response to a control current from the on-vehicle battery through a power supply switch and an instruction power supply terminal of the connector to energize an exciting coil of the power supply relay;

a power supply failure determination circuit;

a power supply failure storage circuit;

a RAM memory for arithmetic processing; and a nonvolatile data memory cooperated with the microprocessor, wherein:

the control program further serves as power supply failure read/delete means to operate the microprocessor;

the auxiliary power supply circuit continues, even when the output contact of the power supply relay is being opened, power feeding to the RAM memory to hold a storage state of at least a part of an address region and to feed power to the power supply failure storage circuit;

the power supply failure storage circuit detects a state in which the power supply voltage is applied to the instruction power supply terminal and the power supply voltage is not applied to the main power supply terminal to generate a logical determination output for determining one of that the output contact of the power supply relay is in an opened state and that output wiring is in a broken state;

the power supply failure storage circuit comprises a flip-flop circuit which is set when the logical determination output of the power supply failure determination circuit exhibits a power supply abnormality; and the power supply failure read/delete means is executed when the power feeding to the microprocessor restarts, reads out the abnormality storage state from the power supply failure storage circuit and temporarily stores as the power supply failure information in the RAM memory, and resets the abnormality storage state of the power supply failure storage circuit along with a completion of storage of the power supply failure information to store the power supply failure information temporarily stored in the RAM memory in the nonvolatile data memory immediately after the power supply switch is opened.

13. A power supply abnormality detection circuit for an on-vehicle electronic control device according to claim 12, further comprising an OR circuit operating with power fed from the instruction power supply terminal,
wherein the OR circuit operates one of when the power supply failure determination circuit generates the logical determination output indicating the power supply abnormality and when the microprocessor generates an abnormality warning output signal to drive a warning indicator.

14. A power supply abnormality detection circuit for an on-vehicle electronic control device according to claim 1, wherein:
the on-vehicle electronic control device further cooperates with a combined on-vehicle electronic control device operating with power fed from the on-vehicle battery;
the combined on-vehicle electronic control device measures a dividing voltage of the power supply voltage of the on-vehicle battery and transmits the measured voltage as a fourth dividing voltage to the on-vehicle electronic control device through a communication line;
the power supply abnormality detection circuit for an on-vehicle electronic control device further comprises a bypass detection circuit section including a main voltage dividing circuit and a multi-channel A/D converter;
the main voltage dividing circuit divides a voltage applied to the main power supply terminal to generate a first dividing voltage;
the multi-channel A/D converter performs A/D conversion on the first dividing voltage and the fourth dividing voltage and outputs a resultant to the microprocessor; and
the bypass detection means detects the bypass power fed state caused due to the contact failure of the main power supply terminal when the fourth dividing voltage exceeds the first dividing voltage.

15. A power supply abnormality detection circuit for an on-vehicle electronic control device according to claim 1, wherein, before a start of input and output control performed by the microprocessor, the bypass detection means causes the first switching element to be in the opened state and then checks presence or absence of a bypass abnormality.

* * * * *